(12) United States Patent
Platzgummer

(10) Patent No.: US 9,799,487 B2
(45) Date of Patent: Oct. 24, 2017

(54) BI-DIRECTIONAL DOUBLE-PASS MULTI-BEAM WRITING

(71) Applicant: IMS Nanofabrication AG, Vienna (AT)

(72) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 15/073,935

(22) Filed: Mar. 18, 2016

(65) Prior Publication Data

US 2016/0276131 A1 Sep. 22, 2016

Related U.S. Application Data

(60) Provisional application No. 62/134,923, filed on Mar. 18, 2015.

(51) Int. Cl.
*H01J 37/20* (2006.01)
*G21K 5/04* (2006.01)
(Continued)

(52) U.S. Cl.
CPC .......... *H01J 37/3026* (2013.01); *H01J 37/20* (2013.01); *H01J 37/3177* (2013.01);
(Continued)

(58) Field of Classification Search
CPC .... H01J 37/3026; H01J 37/20; H01J 37/3177; H01J 2237/202; H01J 2237/20221; H01J 2237/31766
(Continued)

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
EP 0178156 A2 4/1986
(Continued)

OTHER PUBLICATIONS

US 9,443,052, 09/2016, Platzgummer et al. (withdrawn)
(Continued)

*Primary Examiner* — Nicole Ippolito
(74) *Attorney, Agent, or Firm* — KPPB LLP

(57) ABSTRACT

To irradiate a target with a beam of energetic electrically charged particles, the beam is formed and imaged onto a target, where it generates a pattern image composed of pixels. The pattern image is moved along a path on the target over a region to be exposed, and this movement defines a number of stripes covering said region in sequential exposures and having respective widths. The number of stripes is written in at least two sweeps which each have a respective general direction, but the general direction is different for different sweeps, e.g. perpendicular to each other. Each stripe belongs to exactly one sweep and runs substantially parallel to the other stripes of the same sweep, namely, along the respective general direction. For each sweep the widths, as measured across said main direction, of the stripes of one sweep combine into a cover of the total width of the region.

16 Claims, 19 Drawing Sheets

(51) Int. Cl.
*H01J 37/302* (2006.01)
*H01J 37/317* (2006.01)

(52) U.S. Cl.
CPC .............. *H01J 2237/202* (2013.01); *H01J 2237/20221* (2013.01); *H01J 2237/31766* (2013.01)

(58) Field of Classification Search
USPC ......... 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 1,903,005 A | 3/1933 | McCuen | |
| 2,187,427 A | 1/1940 | Middleton | |
| 2,820,109 A | 1/1958 | Dewitz | |
| 2,920,104 A | 1/1960 | Brooks et al. | |
| 3,949,265 A | 4/1976 | Holl | |
| 4,467,211 A | 8/1984 | Smith | |
| 4,735,881 A | 4/1988 | Kobayashi et al. | |
| 4,899,060 A | 2/1990 | Lischke | |
| 5,103,101 A | 4/1992 | Berglund et al. | |
| 5,260,579 A | 11/1993 | Yasuda et al. | |
| 5,369,282 A | 11/1994 | Arai et al. | |
| 5,399,872 A | 3/1995 | Yasuda et al. | |
| 5,814,423 A | 9/1998 | Maruyama et al. | |
| 5,841,145 A | 11/1998 | Satoh et al. | |
| 5,847,959 A | 12/1998 | Veneklasen et al. | |
| 5,857,815 A | 1/1999 | Bailey et al. | |
| 5,876,902 A | 3/1999 | Veneklasen | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 | 5/2001 | McKinley | |
| 6,252,339 B1 | 6/2001 | Kendall | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki et al. | |
| 6,617,587 B2 | 9/2003 | Parker | |
| 6,767,125 B2 | 7/2004 | Midas et al. | |
| 6,768,123 B2 | 7/2004 | Giering | |
| 6,768,125 B2 | 7/2004 | Platzgummer et al. | |
| 6,786,125 B2 | 9/2004 | Imai | |
| 6,835,937 B1 | 12/2004 | Muraki et al. | |
| 6,858,118 B2 | 2/2005 | Platzgummer et al. | |
| 6,897,454 B2 | 5/2005 | Sasaki et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson | |
| 7,214,951 B2 | 5/2007 | Stengl et al. | |
| 7,276,714 B2 | 10/2007 | Platzgummer et al. | |
| 7,446,601 B2 | 11/2008 | LeChevalier | |
| 7,459,247 B2 | 12/2008 | Bijnen et al. | |
| 7,671,687 B2 | 3/2010 | LeChevalier | |
| 7,687,783 B2 | 3/2010 | Platzgummer et al. | |
| 7,710,634 B2 | 5/2010 | Sandstrom | |
| 7,714,298 B2 | 5/2010 | Platzgummer | |
| 7,741,620 B2 | 6/2010 | Doering et al. | |
| 7,772,574 B2 | 8/2010 | Stengl et al. | |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Fragner et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2 | 9/2012 | Sczyrba et al. | |
| 8,258,488 B2 | 9/2012 | Platzgummer et al. | |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2 | 8/2013 | Wieland | |
| 8,531,648 B2 | 9/2013 | Jager et al. | |
| 8,546,767 B2 | 10/2013 | Platzgummer et al. | |
| 8,563,942 B2 | 10/2013 | Platzgummer | |
| 8,598,544 B2 | 12/2013 | Van De Peut et al. | |
| 9,053,906 B2* | 6/2015 | Platzgummer | H01J 37/3026 |
| 9,093,201 B2 | 7/2015 | Platzgummer et al. | |
| 9,099,277 B2 | 8/2015 | Platzgummer | |
| 9,188,874 B1 | 11/2015 | Johnson | |
| 9,269,543 B2 | 2/2016 | Reiter et al. | |
| 9,335,638 B2 | 5/2016 | Jager et al. | |
| 9,373,482 B2 | 6/2016 | Platzgummer | |
| 9,443,699 B2 | 9/2016 | Platzgummer et al. | |
| 9,495,499 B2 | 11/2016 | Platzgummer et al. | |
| 9,520,268 B2 | 12/2016 | Platzgummer | |
| 9,568,907 B2 | 2/2017 | Platzgummer et al. | |
| 9,653,263 B2 | 5/2017 | Platzgummer et al. | |
| 2001/0028038 A1 | 10/2001 | Hamaguchi et al. | |
| 2002/0021426 A1 | 2/2002 | Mei et al. | |
| 2002/0148978 A1 | 10/2002 | Innes et al. | |
| 2003/0085360 A1 | 5/2003 | Parker et al. | |
| 2003/0106230 A1 | 6/2003 | Hennessey | |
| 2003/0155534 A1 | 8/2003 | Platzgummer et al. | |
| 2003/0160980 A1 | 8/2003 | Olsson et al. | |
| 2004/0058536 A1 | 3/2004 | Ki | |
| 2004/0119021 A1 | 6/2004 | Parker et al. | |
| 2004/0157407 A1 | 8/2004 | Tong et al. | |
| 2004/0169147 A1 | 9/2004 | Ono et al. | |
| 2005/0063510 A1 | 3/2005 | Hieronimi et al. | |
| 2005/0072941 A1 | 4/2005 | Tanimoto et al. | |
| 2005/0104013 A1 | 5/2005 | Stengl et al. | |
| 2005/0242302 A1 | 11/2005 | Platzgummer et al. | |
| 2005/0242303 A1* | 11/2005 | Platzgummer | B82Y 10/00 250/492.22 |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1 | 6/2008 | Doering et al. | |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0237460 A1 | 10/2008 | Fragner et al. | |
| 2008/0257096 A1 | 10/2008 | Zhu et al. | |
| 2008/0260283 A1 | 10/2008 | Ivansen | |
| 2008/0283767 A1 | 11/2008 | Platzgummer | |
| 2008/0299490 A1 | 12/2008 | Takekoshi | |
| 2009/0032700 A1 | 2/2009 | Park et al. | |
| 2009/0101816 A1 | 4/2009 | Noji et al. | |
| 2009/0256075 A1 | 10/2009 | Kemen et al. | |
| 2009/0321631 A1 | 12/2009 | Smick et al. | |
| 2010/0127185 A1 | 5/2010 | Fragner et al. | |
| 2010/0127431 A1* | 5/2010 | Sandstrom | G06K 17/00 264/400 |
| 2010/0178602 A1 | 7/2010 | Seto et al. | |
| 2010/0187434 A1 | 7/2010 | Platzgummer et al. | |
| 2010/0288938 A1 | 11/2010 | Platzgummer | |
| 2011/0053087 A1 | 3/2011 | Nielsen et al. | |
| 2011/0073782 A1 | 3/2011 | Wieland | |
| 2011/0121208 A1 | 5/2011 | Nakayamada et al. | |
| 2011/0204253 A1 | 8/2011 | Platzgummer et al. | |
| 2011/0226968 A1 | 9/2011 | Platzgummer | |
| 2012/0007002 A1 | 1/2012 | Nakayamada et al. | |
| 2012/0076269 A1 | 3/2012 | Roberts et al. | |
| 2012/0085940 A1 | 4/2012 | Matsumoto | |

(56) References Cited

U.S. PATENT DOCUMENTS

| | | |
|---|---|---|
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2013/0157198 A1 | 6/2013 | Ogasawara et al. |
| 2013/0164684 A1 | 6/2013 | Yamanaka |
| 2013/0198697 A1 | 8/2013 | Hotzel et al. |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0197327 A1 | 7/2014 | Platzgummer |
| 2014/0240732 A1 | 8/2014 | Tinnemans et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada et al. |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1* | 12/2015 | Platzgummer ...... G06F 17/5072 716/52 |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276132 A1 | 9/2016 | Platzgummer |
| 2016/0336147 A1 | 11/2016 | Platzgummer |

FOREIGN PATENT DOCUMENTS

| | | |
|---|---|---|
| EP | 1033741 A2 | 9/2000 |
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| EP | 2950325 A1 | 12/2015 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for Application 15159397.7, report dated Sep. 28, 2015, 8 pgs.
European Search Report for Application 15159617.8, report dated Oct. 19, 2015, 4 pgs.
Wheeler et al., "Use of Electron Beams in VLSI", G.E.C. Journal of Science and Technology, General Electric Company, Wembley, Middlesex, GB, vol. 48, No. 2, Jan. 1, 1982, pp. 103-107, XP000820522.
European Search Report for Application 08450077.6, report dated Jan. 29, 2010, 2 pgs.
European Search Report for Application 09450211.9-1226, report dated Sep. 14, 2010, 4 pgs.
European Search Report for Application 09450212.7, report dated Sep. 28, 2010, 9 pgs.
European Search Report for Application 141501197.7, report dated Jun. 6, 2014, 2 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851, report dated Oct. 16, 2014, 1 page.
European Search Report for Application 14199183, report dated Jun. 19, 2015, 2 pgs.
European Search Report for Application 15164770, report dated Sep. 18, 2015, 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, Report dated Dec. 1, 2014, 1 pg.
European Search Report for Application 10450070.7, report dated May 7, 2012, 13 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al., "Characterization of CMOS programmable multi-beam blanking arrays as used for programmable multi-beam projection lithography and resistless nanopatterning", Journal of Micromechanics and Microengineering, 21, 2001, pp. 1-8.
Li, H. Y. et al., "Through-Silicon Interposer Technology for Heterogeneous Integration", Future Fab Intl., Issue 45, Apr. 25, 2013.
Paraskevopoulos, A. et al., "Scalable (24-140 Gbps) optical data link, well adapted for future maskless lithography applications", Proc. SPIE vol. 7271, 72711 I, 2009.
Platzgummer, Elmar et al., "eMET POC: Realization of a proof-of-concept 50 keV electron multibeam Mask Exposure Tool", Proc. of SPIE vol. 8166, 816622-1, 2011.
Platzgummer et al., "eMET—50keV electron Mask Exposure Tool Development based on proven multi-beam projection technology", Proc. of SPIE, vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for EP Application No. 16174185, Search Completed Dec. 6, 2016, 2 pgs.
European Search Report for European Application No. 16160622, Search completed Jul. 21, 2016, dated Jul. 21, 2016, 3 Pgs.
European Search Report for European Patent Application 16160621, Completion date Oct. 5, 2016, 3 pgs.

* cited by examiner

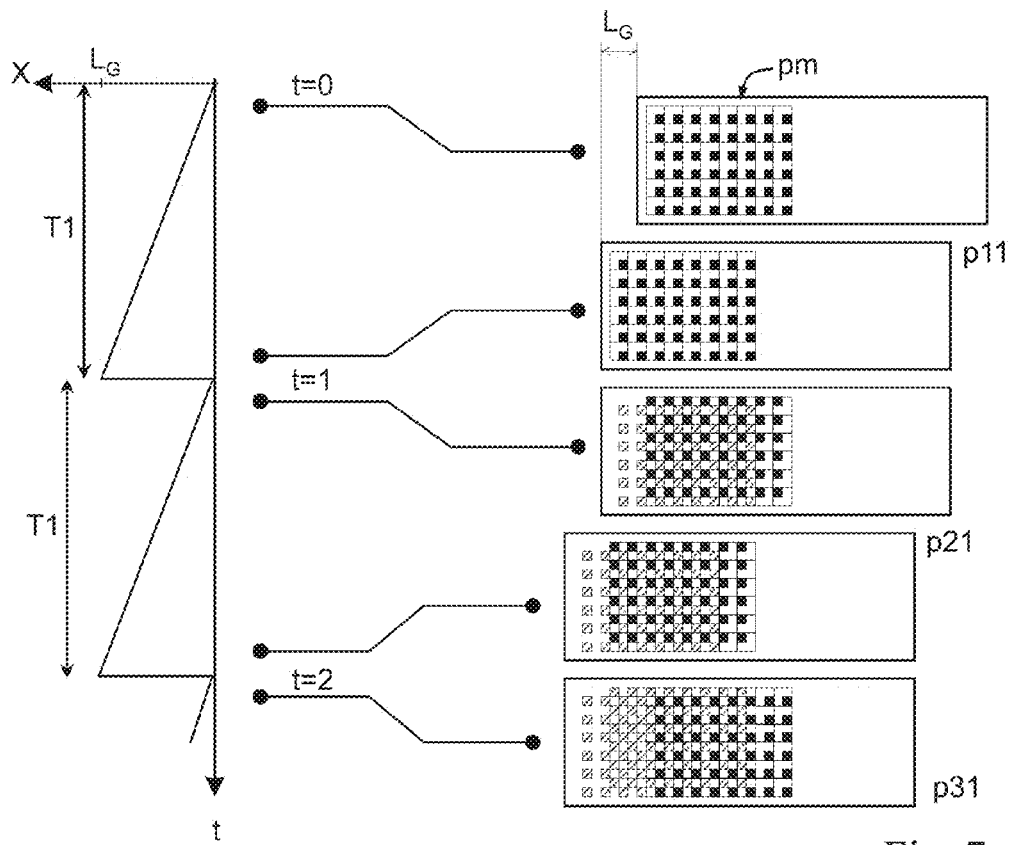
Fig. 7A (prior art)
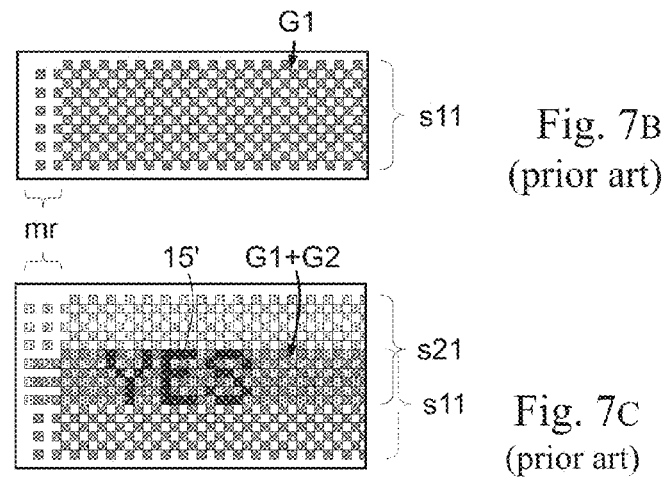
Fig. 7B (prior art)
Fig. 7C (prior art)

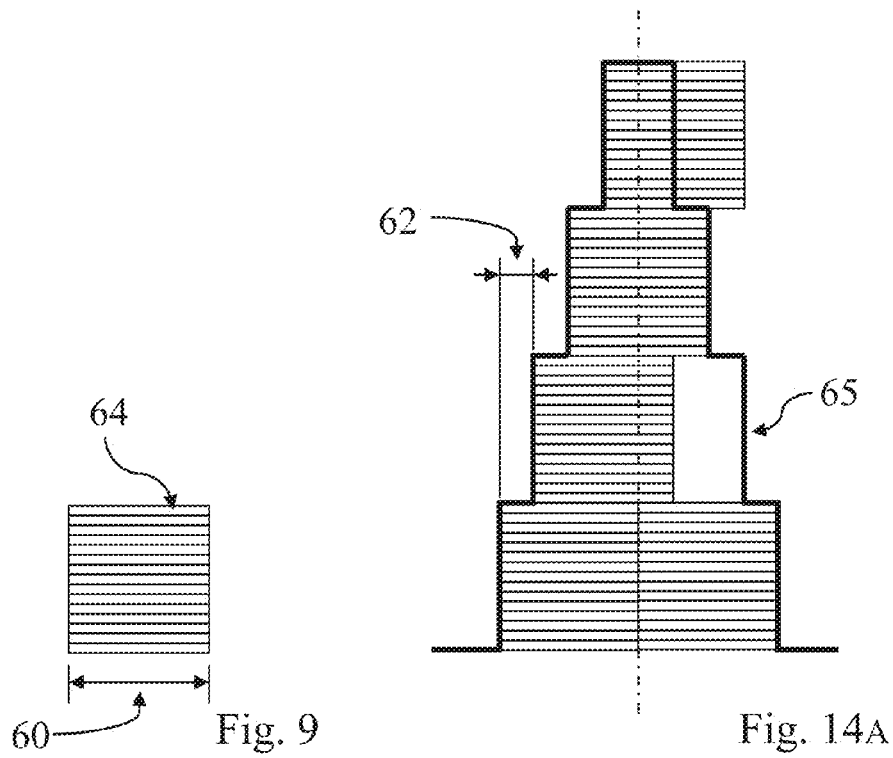
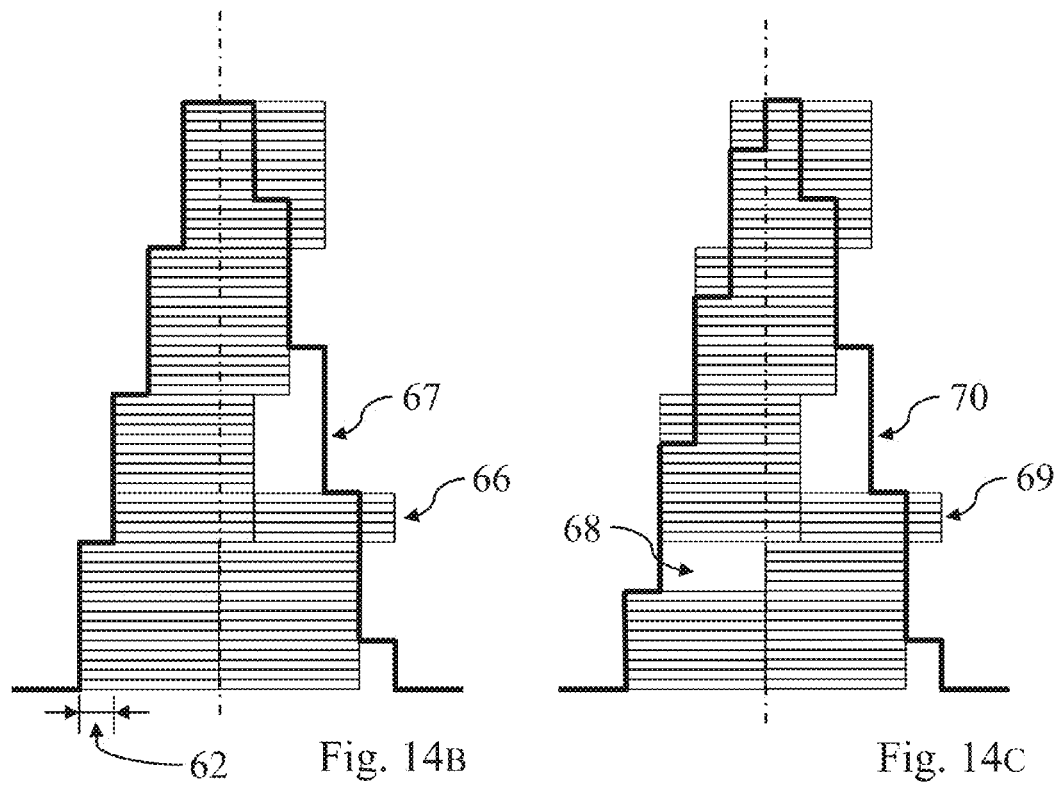

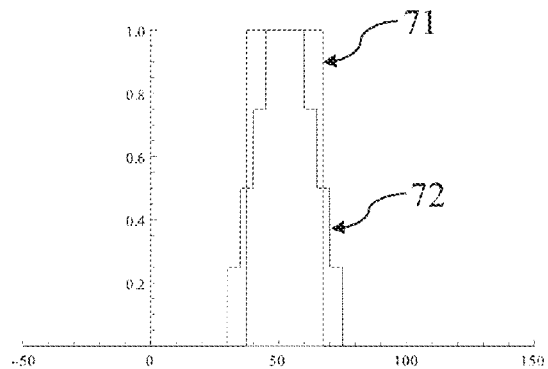
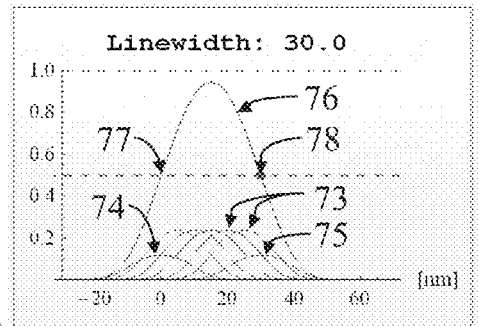
Fig. 10    Fig. 11
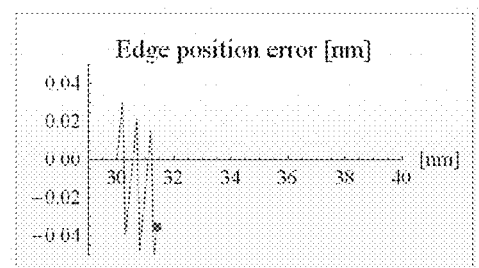
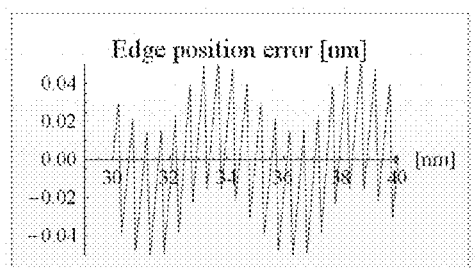
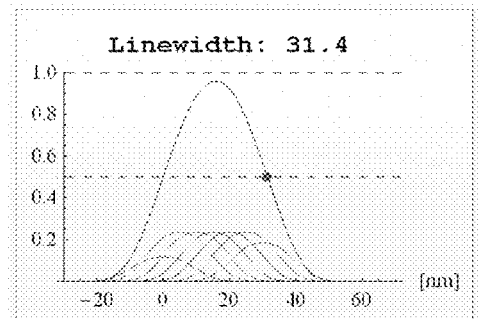
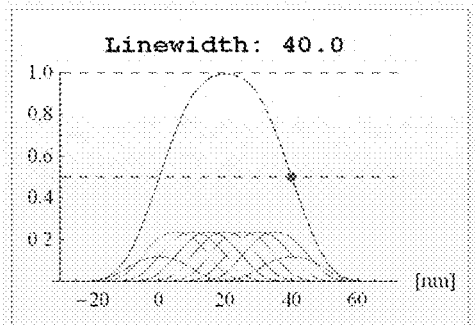
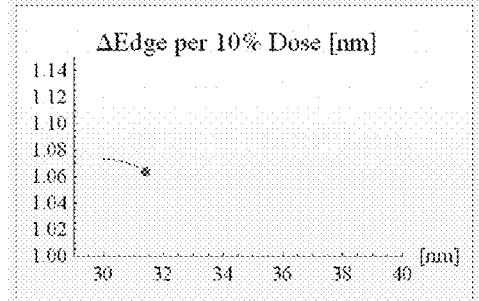
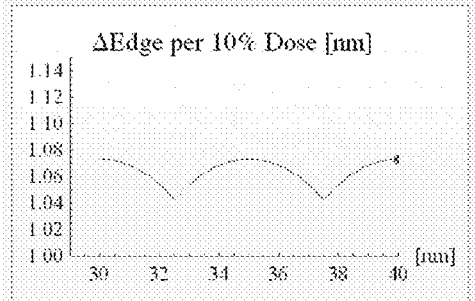
Fig. 12A    Fig. 12B

BI-DIRECTIONAL DOUBLE-PASS MULTI-BEAM WRITING

CROSS-REFERENCE TO RELATED APPLICATION

The current application claims priority to U.S. Provisional Application No. 62/134,923, filed Mar. 18, 2015, the disclosure of which is incorporated herein by reference.

FIELD OF THE INVENTION AND DESCRIPTION OF PRIOR ART

Many embodiments of the invention relate to a method for forming a pattern on a surface of a substrate or target by means of a beam of energetic electrically charged particles. More in detail, certain embodiments of the invention relate to a method for irradiating a target with a beam of energetic radiation comprising electrically charged particles, comprising the steps of providing a pattern definition device having a plurality of apertures transparent to said radiation, illuminating said pattern definition device by means of an illuminating wide beam, which traverses the pattern definition device through said apertures thus forming a patterned beam consisting of a corresponding plurality of beamlets, forming said patterned beam into a pattern image on the location of the target, said pattern image comprising the images of at least part of the plurality of apertures covering a number of pattern pixels on the target, and generating a relative movement between said target and the pattern definition device producing a movement of said pattern image on the target along a path over a region where a beam exposure is to be performed, said path being composed of sections which each extend along a general direction, said region being composed of a plurality of pattern pixels arranged in a regular arrangement and said region having a total width as measured across said general direction, the movement along said path defining a number of stripes covering said region in sequential exposures.

Methods of the above-described type and charged-particle multi-beam processing apparatuses employing such methods are well-known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithograph, of masks for EUV lithography and of templates (1×masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. Multi-beam processing apparatuses of the said kind are hereinafter referred to as multi-beam writer, or short MBW.

As a typical implementation of an MBW, the applicant has realized a 50 keV electron writer tool implementing a total beam size of 20 nm comprising 512×512 (=262,144) programmable beamlets within a beam array field of dimensions 81.92 μm×81.92 μm at the substrate. In this system, which is referred to as "MBMW tool" hereinafter, the substrate is, typically, a 6" mask blank (having an area of 6"×6"=152.4 mm×152.4 mm and thickness 6"/4=6.35 mm) covered with an electron beam sensitive resist; furthermore, multi-beam writing is possible on resist-covered 150 mm Si wafers as well.

The current density of a typical MBW, such as the MBMW tool, is no higher than 1 A/cm$^2$ when using 20 nm beam size. Thus, when all programmable 262,144 beamlets are "on" the maximum current is 1.05 μA. In this implementation the 1 sigma blur of the MBW column is approx. 5 nm, as verified experimentally.

There is the possibility to change the beam size, e.g., from 20 nm to 10 nm. For a column with 200:1 reduction this is straightforward by using a different aperture array plate (AAP), with 2 μm×2 μm opening size of the apertures instead of 4 μm×4 μm opening size. As outlined in U.S. Pat. No. 8,546,767 of the applicant, a change of the beam size may also be realized in-situ by spatial adjustment of the AAP having multiple aperture arrays of different geometric parameters, such a total size, aperture spacing, aperture shapes etc.

When using a 10 nm beam size and providing a current density at the substrate of no higher than 4 A/cm$^2$, the current of 262,144 programmable beamlets (with all beamlets "on") is again 1.05 μA at maximum. Thus, also in this case there is virtually no change of the 1 sigma blur of the column with current through the column.

The first generation MBW production machines are targeted to use 20 nm and 10 nm beams providing up to approx. 1 μA current for all 262,144 programmable beams "on". For following generations of MBW production machines there is the plan to use even smaller beam size, for instance of 8 nm, and concurrently to provide e.g. 640×640=409,600 beamlets within the 81.92 μm×81.92 μm beam array field at the substrate. Keeping the maximum current density at 4 A/cm$^2$ will ensure that the maximum current (with all beamlets "on") is 1.05 μA. For instance, using a 5 nm beam size allows providing e.g. 1024×1024=1,048,576 programmable beams within the mentioned beam array field at the substrate; again, at a maximum current density of 4 A/cm$^2$ the maximum current (with all beamlets "on") is 1.05 μA.

For industrial applications, very demanding MBW performance requirements are imposed with respect to achieving a small Critical Dimension (CD) and, in particular, to achieving 3sigma or 6sigma variations at a nanometer level of the Local CD Uniformity (LCDU) within small fields (e.g. the area of the MBW beam array field) as well as nanometer level 3sigma or 6sigma variations of the Global CD Uniformity (GCDU) over the whole MBW writing field on a substrate (e.g. a 6" mask blank or a 300 mm Silicon wafer).

Furthermore, it is desired to fine-adjust the line edge position by means of a specifically adapted exposure dose profile. Furthermore, such a fine-adjustment should not only be adaptable within the MBW beam array field (local) but also over the whole MBMW writing field on a substrate (global).

Using the MBW architecture of the applicant, low CD values can be achieved and small LCDU and GCDU values. However, in order to fulfill the very demanding MBW specifications of very low LCDU and GCDU values, there is the need for additional fine corrections. Here, the terms "local" and "global" refer again to small fields (e.g. the area of the MBW beam array field) and the whole MBW writing field on a substrate, respectively.

U.S. Pat. No. 8,378,320 B2 of the applicant describes a multi-beam writing method, which may be designated "Single-Pass-with-Soft-Butting", where the target (substrate) is exposed in a sequence of exposure stripes. The exposure stripes are realized by mechanically scanning the substrate in one direction (e.g.: +X) and in the opposite direction (−X) by means of a target stage on which the target is placed. In order to move from one stripe exposure to the next, the substrate is moved in the perpendicular direction by a distance which corresponds to the stripe width or, in the case of overlapping stripes, by a smaller amount depending on the stripe overlap chosen. The stage velocity in the stripe exposure direction is high, i.e. in the order of mm/s. A high stage velocity in the stripe exposure direction is mandatory to achieve an acceptable writing time due to the long stripe length (e.g. 132 mm when exposing a mask field of 132 mm×104 mm). On the other hand, the stage velocity in the other direction need not be high since the maximal distance is the stripe width, which is about 0.1 mm. For example, in the MBW tool realized by the applicant the beam array field at the substrate covers an area of c. 82 µm×82 µm and thus the exposure stripe has a width of 82 µm in this case.

As outlined in US 2015/0028230 A1 of the applicant, even better reduction of stripe butting errors may be achieved by implementing a multi-beam exposure method, which could be termed "Double-Pass-at-50%-Overlap", where the first set of stripes is exposed with half of the exposure spots whereas the second set of stripes is exposed with 50% overlay, again with half of the exposure spots. Thus, both sets of stripe exposures together realize the pattern with the desired exposure dose. As also pointed out in the above cited patent application, the sequence of stripe writing may be chosen to strongly reduce resist heating, resist charging and substrate heating effects by employing a "Multiple-Stripes" method, where the exposure is split into multiple stripes distributed across the plate by predefined sequence and distribution. The Multiple-Stripes method can be implemented for various writing techniques, including Single-Pass-with-Soft-Butting and Double-Pass-at-50%-Overlap; it can also be combined with the writing methods disclosed in the instant application.

Although the previously mentioned methods of the applicant from U.S. Pat. No. 8,378,320 B2 and US 2015/0028230 A1 already yield a distinct improvement of the writing quality of the MBW tool, a further enhancement is still desirable. In particular there is always a need for further reducing misplacements through an increased level of averaging over the beam array field. Since there are increasingly tightened demands on Local and Global Critical Dimension Uniformity, LCDU and GCDU, respectively, and also on local and global pattern placement accuracy ("Registration"), additional innovations are necessary as described below.

In view of the above, it is an objective of many embodiments of the present invention to overcome these shortcomings of prior art.

SUMMARY OF THE INVENTION

The above-mentioned objective is met by a method as described in the beginning wherein the number of stripes is written in at least two sweeps, which each have a respective general direction, but the general direction being changed between sweeps. It is important to note that the term "general direction" is meant to include both ways of moving along a given direction on the target plane. Each stripe belongs to exactly one of said sweeps, and runs substantially parallel to the other stripes of the same sweep, namely, along the respective general direction. The stripes have respective widths as measured across said main direction, and for each sweep the widths of the stripes of one sweep will combine into a cover of the total width (i.e., the width of the region to be exposed when measured across the respective general direction). Thus, one sweep has at least one stripe written along a respective general direction which is at an angle (non-trivial angle, i.e. greater than 0° and up to 90°) to that of the respective previous sweep; and in one suitable special case, the angle between general directions of consecutive sweeps is a right angle (90°). The number of sweeps is usually two, or may be an even number, in particular in the case of two general directions at a right angle; generally, however, any number of sweeps may be possible.

Conventional vacuum X-Y stages usually have the capability of high stage velocity in one direction only. This is adequate for the multi-beam exposure of stripes as outlined above. Recently, however, an air-bearing X-Y vacuum stage became available which has the capability of high stage velocity in X as well as in Y direction. This stage, in combination with an MBW tool as described above, allows to adopt a "Bi-Directional" multi-beam writing method to achieve improved LCDU, and GCDU, as well as local and global Registration.

This method according to certain embodiments of the invention allows the adoption of a multi-beam writing method which will be referred to as "Bi-Directional-Double-Pass" in short. With this method, there is efficient averaging of local beam-to-substrate errors and beam array field errors by complete stripe boundary overlap strongly reducing influences of stage noise, beam array field distortion, beam blur distribution and exposure dose inhomogeneity. Thus, the Bi-Directional-Double-Pass represents a considerable improvement to achieve superior multi-beam writing performance.

It is important to note that the "Bi-Directional-Double-Pass" multi-beam writing method of many embodiments of the invention can be implemented without degrading the exposure field write time. The reason is that all exposures can be done at twice the stage velocity as compared to prior methods, in particular the Single-Pass-with-Soft-Butting method.

The exposure with doubled stage velocity is beneficial to reduce local resist and substrate heating and to diminish resist charging.

In an advantageous development of many embodiments of the invention, each sweep may be associated with one of a number of partial grids of pattern pixels which are exposable during the respective sweep, the partial grids being mutually different and, when taken together, combining to the complete plurality of pattern pixels which are comprised in said region where a beam exposure is to be performed.

The groups of stripes belonging to the same sweep are usually written subsequently in time, i.e., in immediate order.

Moreover, a further reduction of time needed for the writing process may be obtained when stripes written with the same general direction are written with alternating orientation of said general direction.

Furthermore, the stripes of each sweep may suitably have uniform width.

Within each sweep the stripes may be exposed at lateral offsets to each other which correspond to the respective widths of the stripes. Alternatively, the stripes of at least one of the sweeps, preferably of all sweeps, may be overlapping. In the overlapping case, wherein in the range of overlap of two stripes of the same sweep: nominal positions of pattern pixels of one of the two stripes are overlapping with nominal positions of corresponding pattern pixels of the other of the two stripes, and pattern pixels are exposed in the two overlapping stripes in a complementary manner with regard to the pattern to be imposed.

In the case that a sweep contains a plurality of stripes to be written, the stripes may be arranged on the target region side by side but in a non-consecutive temporal order. In this case, the plurality of stripes of each sweep may be distributed into at least two groups of spatially adjacent stripes, and the stripes are written either in a time sequence wherein either each stripe is followed by a non-adjacent stripe of a different group, or in a time sequence wherein the stripes are written in groups of stripes according to the order of the groups, with each group of stripes being followed by a non-adjacent different group.

The above-mentioned objective is also achieved by a charged-particle multi-beam processing apparatus for exposure of a target by means of a structured beam of electrically charged particles, comprising an illumination system, a pattern definition device, a projection optics system, and a target stage. The illumination system is configured to produce a beam of said electrically charged particles and form it into an illuminating wide beam illuminating the pattern definition device; the pattern definition device is configured to form the shape of the illuminating beam into a patterned beam composed of a plurality of beamlets; and the projection optics system is configured to form said patterned beam into a pattern image on the location of the target, thus exposing a plurality of pattern pixels on the target; moreover, the target stage is configured to generate a relative movement between said target and the pattern definition device, so the apparatus is enabled to perform the method according to many embodiments of the invention as described above.

In this context, it is additionally suitable to use a target stage which is configured to move and fine position the target along at least two of the general directions. This means that, in particular, the target stage is configured to continuously move the target along at least two of the general directions, wherein any offset from a nominal position, which offset (i.e., the difference between the actual and the nominal position) may occur during a movement by a first distance along either of said at least two of the general directions, is always less than a small fraction of the first distance, where the fraction is preferably equal to or in the order of 0.001. The length of a first distance will generally correspond to the distance covered in a typical time such as one second, or the length or the width of one stripe. For instance, it may be advantageous to enable high stage velocity in an X and a Y direction in the target plane, where high velocity means that it is sufficient to enable a speed sufficient for writing a stripe; for instance a velocity of at least 1 mm/s, or even at least 3.5 mm/s. For instance, the target stage may comprise air bearings. Such target stage can advantageously contribute to an efficient way of generating the relative movement between the target and the pattern definition device.

BRIEF DESCRIPTION OF THE DRAWINGS

In the following, certain embodiments of the present invention are described in more detail with reference to the drawings, which schematically show:

FIG. 7A illustrates the exposure of one stripe;

FIG. 7B shows the stripe resulting from the process of FIG. 7A;

FIG. 7C shows two overlapping strips of different passes;

FIG. 8A: "Double Grid", FIG. 8B: "Quad Grid", and FIG. 8C: "Double-Centered Grid";

FIG. 9 illustrate the intensity profile which is generated when one single exposure spot is exposed with a maximum dose;

FIG. 10 illustrates an intensity profile of the MBW of the type shown in FIG. 1, and a dose level profile for a 30 nm line;

FIG. 11 shows an intensity profile for the 30 nm line dose level profile of FIG. 10;

FIGS. 12A,B illustrate MBW intensity profiles and related data as obtained for a simulation of a line, with a line width of 31.4 nm (FIG. 12A) and 40.0 nm (FIG. 12B), respectively.

FIG. 14A illustrates the intensity profile generated from the exposure of a line of a determined width;

FIGS. 14B,C illustrate the fine adjustment of the position of one edge (FIG. 14B) or both edges (FIG. 14*c*) of the line of FIG. 14A via suitable modifications of the dose levels corresponding the exposure spots;

DETAILED DESCRIPTION

It should be appreciated that the invention is not restricted to the embodiments discussed in the following, which merely represent suitable implementations of the invention.

Lithographic Apparatus

Figure 1:
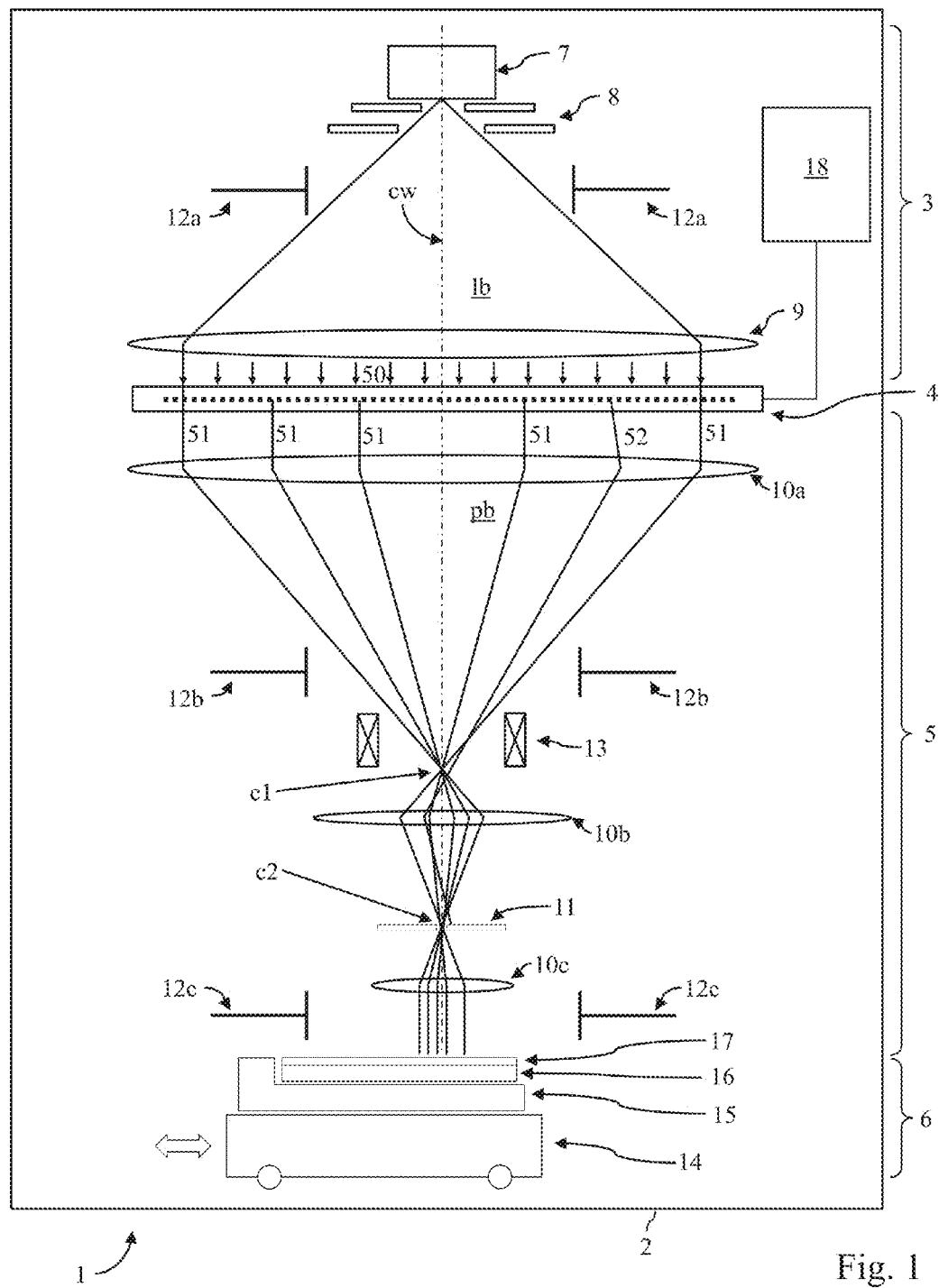
FIG. 1 a MBW system of state of the art in a longitudinal sectional view.

An overview of a lithographic apparatus suitable to employ an embodiment of the invention is shown in FIG. 1. In the following, only those details are given as needed to disclose the described embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6. The substrate stage 14 is, for instance, an air-bearing X-Y vacuum stage able to perform high stage velocity in X as well as in Y direction.

The information regarding the pattern to be exposed is supplied to the PD system 4 by the data path realized by means of an electronic pattern information processing system 18. The data path is explained further below in section "Datapath".

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 12a or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pd "on" or "off", whereas the former only deal with the particle beam as a whole. There is also the possibility to rotate the ensemble of programmable beams using a solenoid 13 providing an axial magnetic field.

Figure 2:
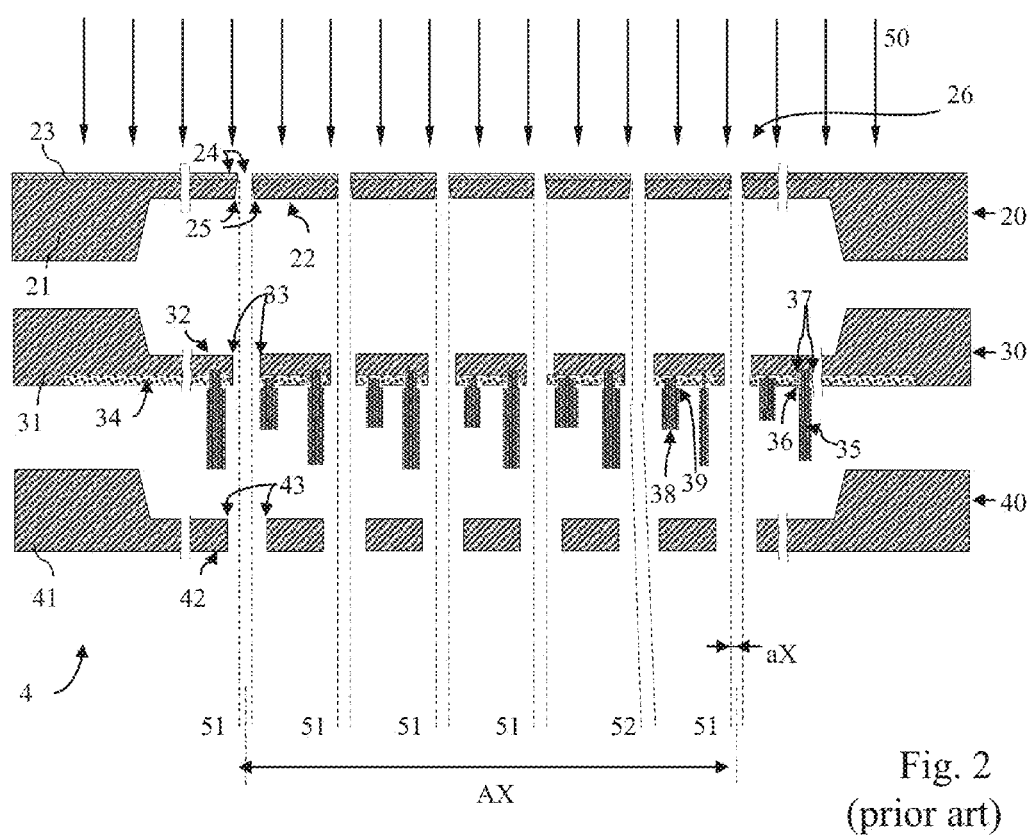
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path.

The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The nominal width of a beamlet at the substrate (i.e. aperture image) is given by $bX=aX/R$ and $bY=aY/R$, respectively, where aX and aY denote the sizes of the beamlet 51 as measured along the X and Y directions, respectively, at the level of the DAP 30.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 μm×82 μm at the substrate. These examples are stated for illustrative purpose, but are not to be construed as limiting examples.

Figure 3:
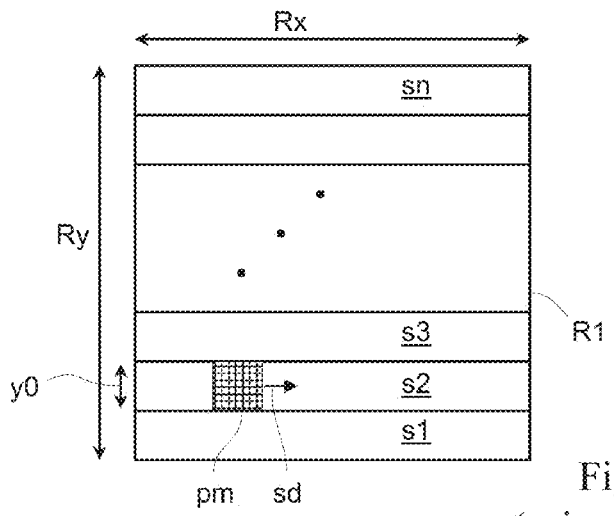
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas R1 to be exposed. Generally, the pattern image pm exposed on the target has a finite size y0 which is usually well smaller than the width of the area R1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the described embodiments of the invention only the relative motion of the pattern image pm on the target is relevant. By virtue of the relative movement the pattern image pm is moved over the area R1 so as to form a sequence of stripes s1, s2, s3, . . . sn (exposure stripes). of width y0. The complete set of stripes covers the total area of the substrate surface. The scanning direction sd may be uniform or may alternate from one stripe to the next.

Figure 5:
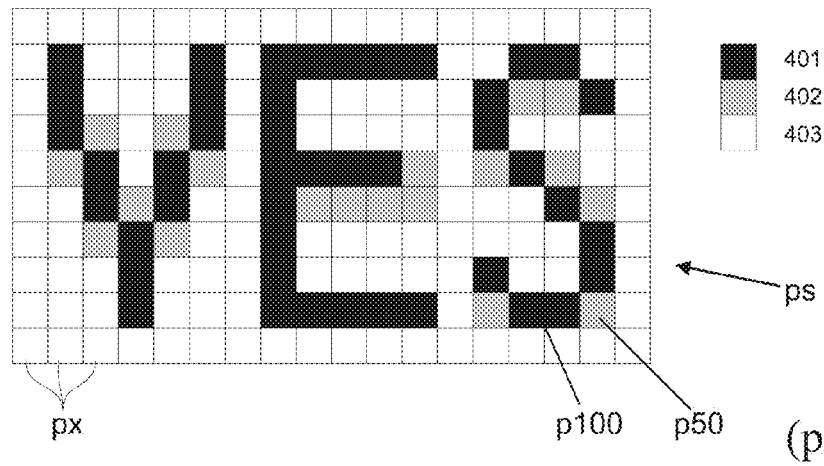
FIG. 5 shows an example of a pixel map of an exemplary pattern to be exposed.

FIG. 5 shows a simple example of an imaged pattern ps with a size of 10×16=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). Of course, in a realistic embodiment of the invention, the number of pixels of the standard image would be much higher. However, in FIG. 5 the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i an integer ("gray index", $0<i<n_y-1$). Generally, however, the gray values need not be equidistant and form a non-decreasing sequence between 0 and 1.

Figure 4:
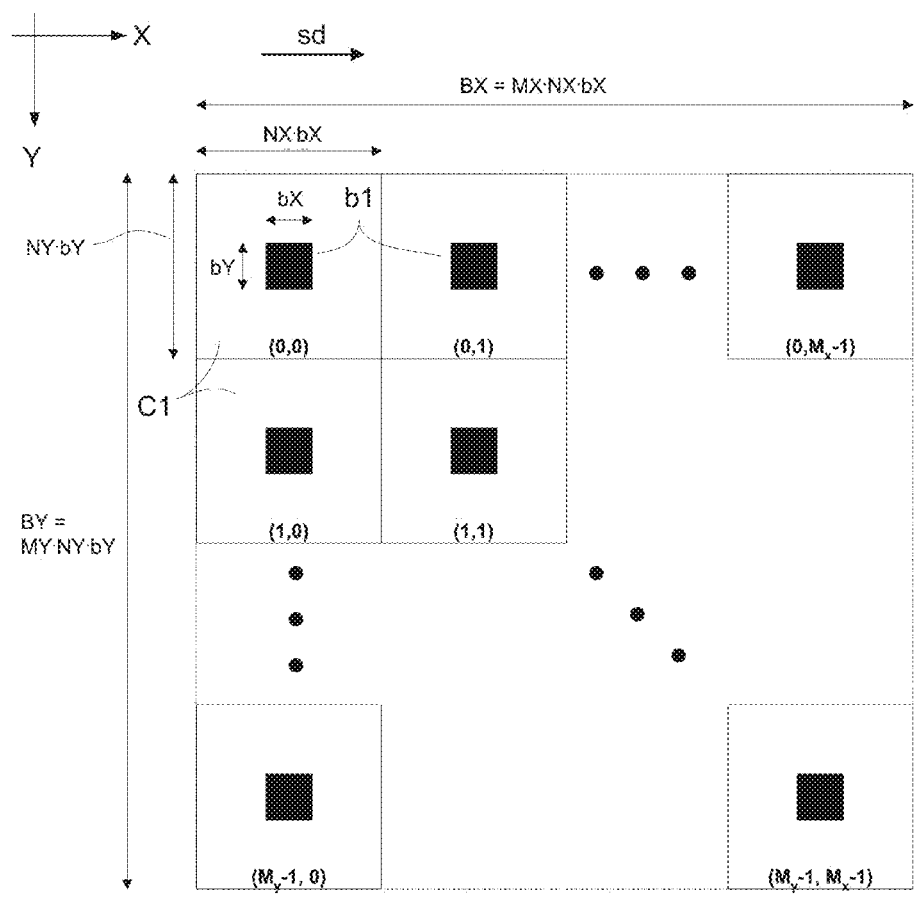
FIG. 4 shows an exemplary arrangement of apertures as imaged onto the target.

FIG. 4 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively.

Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
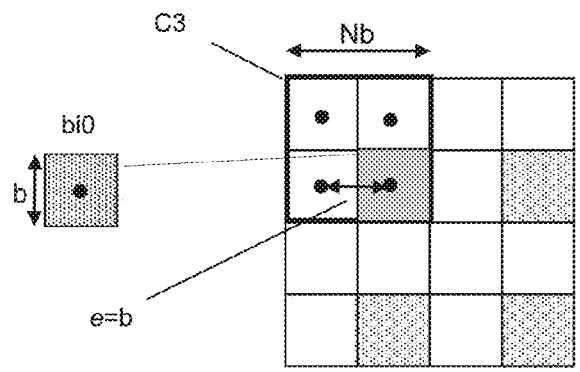
FIG. 6A illustrates an arrangement of apertures with M=2, N=2.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. No. 8,222,621 and U.S. Pat. No. 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
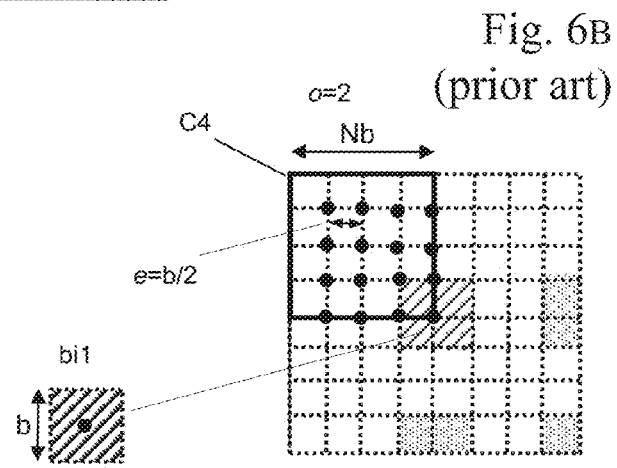
FIG. 6B shows an example of oversampling of the pixels in a "double grid" arrangement.

FIG. 6B illustrates one example of an oversampling of o=2 combined with placement grids. Namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid"), or also a non-integer value greater one, such as 4²=1.414.

The pixel positions in the placement grids may be divided into two or more groups, referred to as "partial grids". For instance, the pixels of the placement grid of FIG. 6A may belong to two partial grids, namely, in an alternating manner according to a checker-board. Placement grids are further explained in U.S. Pat. No. 8,222,621, and partial grids are discussed in US 2015-0028230 A1 in more detail, and the skilled person is referred to those documents with regard to placement grids and partial grids, respectively; the disclosure of those two documents with regard to placement grids and partial grids, respectively, is herewith included by reference.

FIGS. 7A to 7C show an exposure scheme of the pixels for exposing an area on the target which is suitable for many embodiments of the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G=vT1=L/(No)^2=bM/No^2$, which we call "exposure length".

The beamlets are moved over the distance of Lc during the exposure of one set of image elements together with the target. In other words, all beamlets maintain a fixed position with regard to the surface of the substrate during the time interval T1. After moving the beamlets with the target along distance Lc, the beamlets are relocated instantaneously (within a very short time) to start the exposure of the image elements of the next placement grid. After a full cycle through the positions p11 ... p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

With this method it is possible to write stripes of arbitrary length, exposing all pixels of one partial grid G1, as shown in FIG. 7B for the example of stripe s1 associated with grid G1. At the beginning and at the end of the stripe the exposure method may not produce a contiguous covering, so there is a margin mr of width L-LG that is not completely filled.

As illustrated in FIG. 7C, the exposure of the pixels belonging to the other partial grid G2 (or the other partial grids, in case the number of grids is >2) is done by writing another stripe s21. In the context of the instant application, the placement of the stripes of different grids may be with an offset perpendicular to the scanning direction. Within the area of overlap of the stripes s11, s21, the pixels thus exposed can combine into a complete coverage of the pixels to be exposed. However, the stripes s11, s21 will generally not be exposed in immediately successive order, as explained in more detail below.

The size of a single aperture image formed on the target is aX/R, where aX is the opening width of the apertures in the aperture array plate (AAP) and R is the reduction factor of the charged-particle projection optics.

Figure 8A:
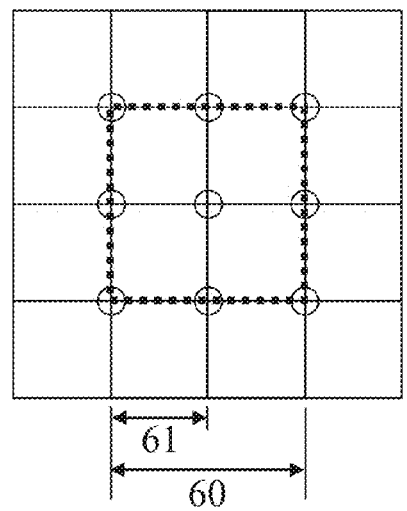
FIGS. 8A-C show three different cases of grid placements, namely
Figure 8B:
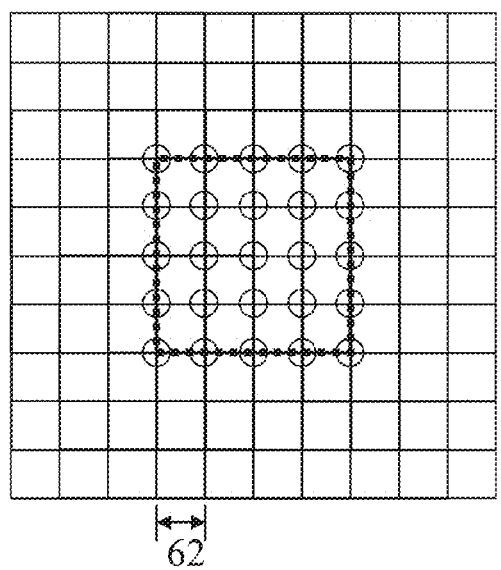
Figure 8C:
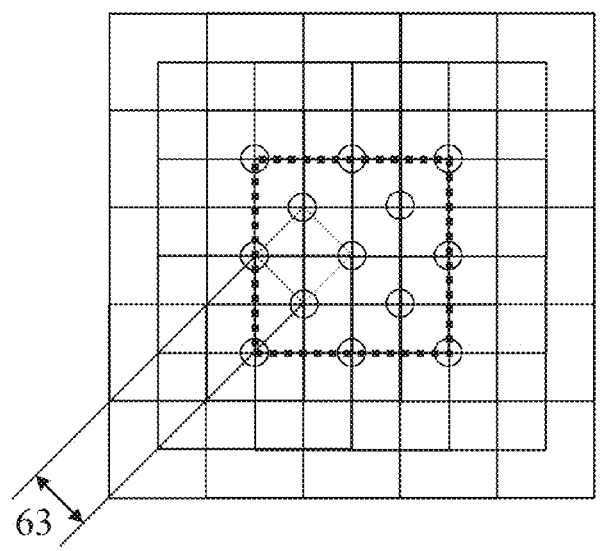

Referring to FIGS. 8A-8C, each exposure spot 60 corresponding to an aperture image bi0, bi1 (FIG. 6A,B) is exposed with discrete dose levels as will be discussed in more detail below. FIGS. 8A-C illustrate various overlap configurations of special interest.

FIG. 8A depicts the "Double-Grid" multi-beam exposure as discussed above with FIG. 6B, where the overlap between the exposure spots is half of the beam spot size in X as well as in Y direction as shown in FIG. 8A. In this case the physical grid size 61 is half of the linear size of the spots 60.

In the "Quad-Grid" multi-beam exposure illustrated in FIG. 8B, the overlap between the spots is ¼ of the beam spot size in X as well as in Y direction. In this case the physical grid size 62 is a quarter of the spot size width.

FIG. 8C depicts another grid layout, where in addition to Double Grid overlapping beam exposures, beam exposures are done in the centers in between. Therefore, the physical grid size 63 is $½^{3/2}$ (i.e., $\sqrt{2}/4$) of the linear spot size. This multi-beam exposure mode is called "Centered-Double-Grid".

FIG. 9 illustrates the exposure of one exposure spot with a maximum dose level. In the exemplary case of a 4 bit coding, there are 16 dose levels (0, 1, 2, ... 15), i.e. the maximum dose level is the sum of 15 dose level increments 64.

Figure 13:
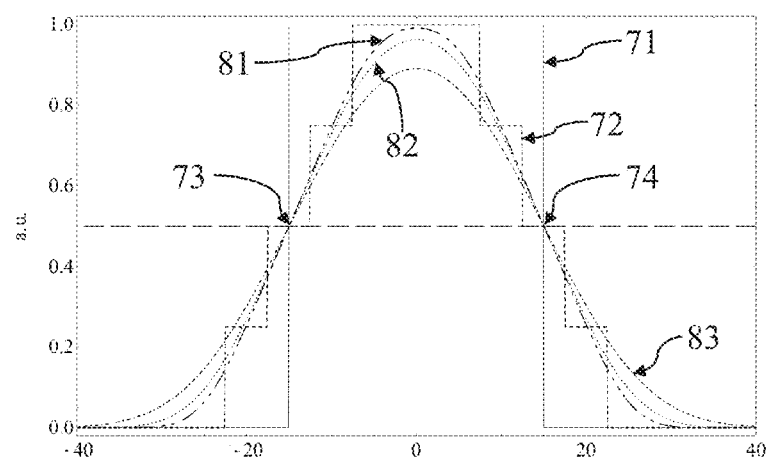
FIG. 13 illustrates the generation of a 30 nm line with the MBW.

FIG. 10 shows the ideal intensity profile 71 for a line of a width 30 nm, in the idealized case of zero blur. When using "Quad-Grid" multi-beam exposure the overlap is a quarter of the beam size. Thus, for the case of 20 nm beam size the physical grid size is 5 nm. A discrete dose level can be assigned to each area of the physical grid, which is 5 nm×5 nm for the example chosen; the line 72 in FIG. 10 indicates the superposition of the intensity (or total dose) as it is composed of the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value such as shown in FIG. 13, the step function at the edge of the rectangle is convoluted with a Gaussian function, which eventually transforms to a Gaussian shape. In that sense the line 72 can be seen as superposition of Gaussian functions at blur zero. In the general case the dose level histogram will not be symmetrical in order to position the left and right edge at pre-defined positions.

FIG. 11 shows a simulation for a line of 30.0 nm width, with the left edge to be positioned at 0.0 nm and the right edge at 30.0 nm. For the simulation, it was assumed that beam spots of 20 nm are exposed with 5.1 nm 1sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that exposed line ends at position 78 at 30.0 nm. As can be seen in FIG. 11, in accordance with "Quad-Grid" exposure, the overlap of the exposure spots 73, 74, 75 is a quarter of the beam size, i.e. 5 nm.

FIGS. 12A and 12B illustrate how certain embodiments of the invention enable the MBW device to write lines with precise edge definitions; in each figure, the top frame shows the edge position error vs. line width, the middle frame the intensity profile, and the bottom frame shows the edge position deviation when enhancing the exposure dose by 10% vs. line width. FIG. 12A shows the intensity profile obtained for a 31.4 nm line width, and FIG. 12B for a 40.0 nm line width. Using the MBW with 20 nm beam size and Quad-Grid exposure (5 nm physical grid size), the line width of the structure generated by the exposure can be changed in steps of 0.1 nm. Because of the integer dose levels there are slight deviations from the 0.1 nm address grid. These deviations are indicated as "edge position error" (top frames), as functions of the desired line width, in 0.1 nm steps between 30.0 nm and 40.0 nm. As can be seen the deviations are within ±0.05 nm. Furthermore, the change of edge position with 10% change of dose is only approx. 1 nm, varying only slightly with change of line width as shown in the bottom frames. In other words, since the dose is controlled in a MBW to better than 1%, the change of edge position with 1% change of dose is within approx. one atomic layer.

Figure 13A:
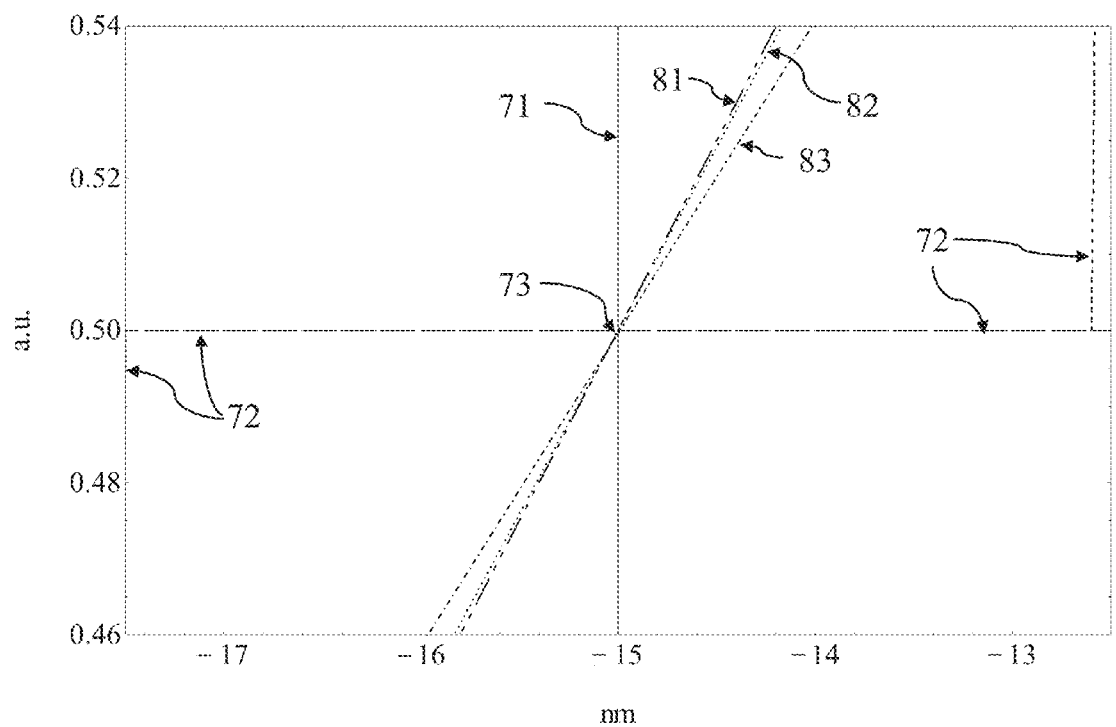
FIG. 13A shows a detail of FIG. 13 at the left-hand flank where the intensity profiles crosses the "0.5" intensity level.

FIG. 13 illustrates a most important advantage of the MBW, namely, that the line width is virtually independent of blur at the 50% dose threshold. Shown in FIG. 13 are the intensity profile 71 for zero blur, the dose level histogram 72, and resulting intensity profiles 81, 82, 83 calculated with 3.5 nm, 5.0 nm, and 7.5 nm 1sigma blur, respectively. The edge positions 73 and 74 of the generated structure are where the zero blur intensity profile 71 crosses the "0.5" intensity level. The enlarged detail of FIG. 13A shows the region around the position 73 at the left-side flank. The dose level assignments 72 are for using 20 nm beam size with 1sigma blur of 5 nm and Quad-Grid multi-beam exposure, providing a 5 nm physical grid size.

FIGS. 14A, 14B, and 14C show intensity profile diagrams illustrating how the multi-beam exposure methods illustrated here can achieve a fine positioning of structure feature with resolution smaller than the grid size. In the intensity profile diagrams, like those of FIGS. 14A-C, the discrete dose levels are visualized as rectangles 64 of uniform height, piled up in a "brick-layer" arrangement; of course, this "brick-layer" depiction is only symbolical and intended to facilitate interpretation of the drawings.

FIG. 14A shows a dose level histogram, for the example of a line of 30 nm width exposed by means of a 4 bit (i.e., 15 dose levels per spot) exposure in a Quad-Grid with a beam spot size of 20 nm width. The grid size 62 is ¼ of the linear size of the exposure spots, which are symbolized as rectangles piled up in a "brick-layer" arrangement, and the resulting dose level distribution 65 is outlined as a bold line.

The line width can be made smaller or larger in very fine steps, which are smaller than the grid size, in this case the Quad-Grid size 62. Reducing the line width can be achieved by lowering the dose level of the outermost exposure spots and/or omitting exposure spots (the latter when the reduction is at least about one half of a, exposure spot size). Increasing the line width can be achieved by enhancing the dose level of the outermost exposure spots and/or, in particular when the maximum dose level has been reached, to add an additional, preferably overlapping, exposure spot. The latter aspect is illustrated in FIG. 14B: an exposure spot 66 having a defined dose level is added, resulting in a dose level histogram 67 for the line with larger width compared to 65. By combining these effects of decreasing and increasing on either side, there is also the possibility to shift the line position in very fine steps. FIG. 14C illustrates a shift of the line without changing the width, which is achieved by removing dose levels from spot 68 and adding corresponding dose levels to spot 69, resulting in the dose level histogram 70 which corresponds to a line shifted to the right as compared to the line of FIG. 14A.

The intensity profiles of FIGS. 14A-C are shown along the X direction of the target plane. It is straightforward to extend the multi-beam exposure methods illustrated here to lines along other directions as well, and fine positioning can be achieved for lines on the target plane with any direction.

A first embodiment of the invention relates to a method of exposing the target area, based on writing of stripes as discussed above in FIGS. 7A-C, where the same target area is covered by more than one set of stripes, referred to as passes. Each pass includes a set of stripes which, taken as a whole cover the target area, by exposing the exposure spots that belong to one of the partial grids, respectively. For instance, in the case of two partial grids the first pass exposes the exposure spots belonging to a first partial grid, and the second pass exposes those of a second partial grid. In addition, the position of the stripes of different passes are offset to each other so stripes of one pass cover the boundary margin between stripes of another pass.

This principle is illustrated in the following by an exemplary embodiment, which implements a method which is also referred to as "Double-Pass-at-50%-Overlap".

Figure 15:
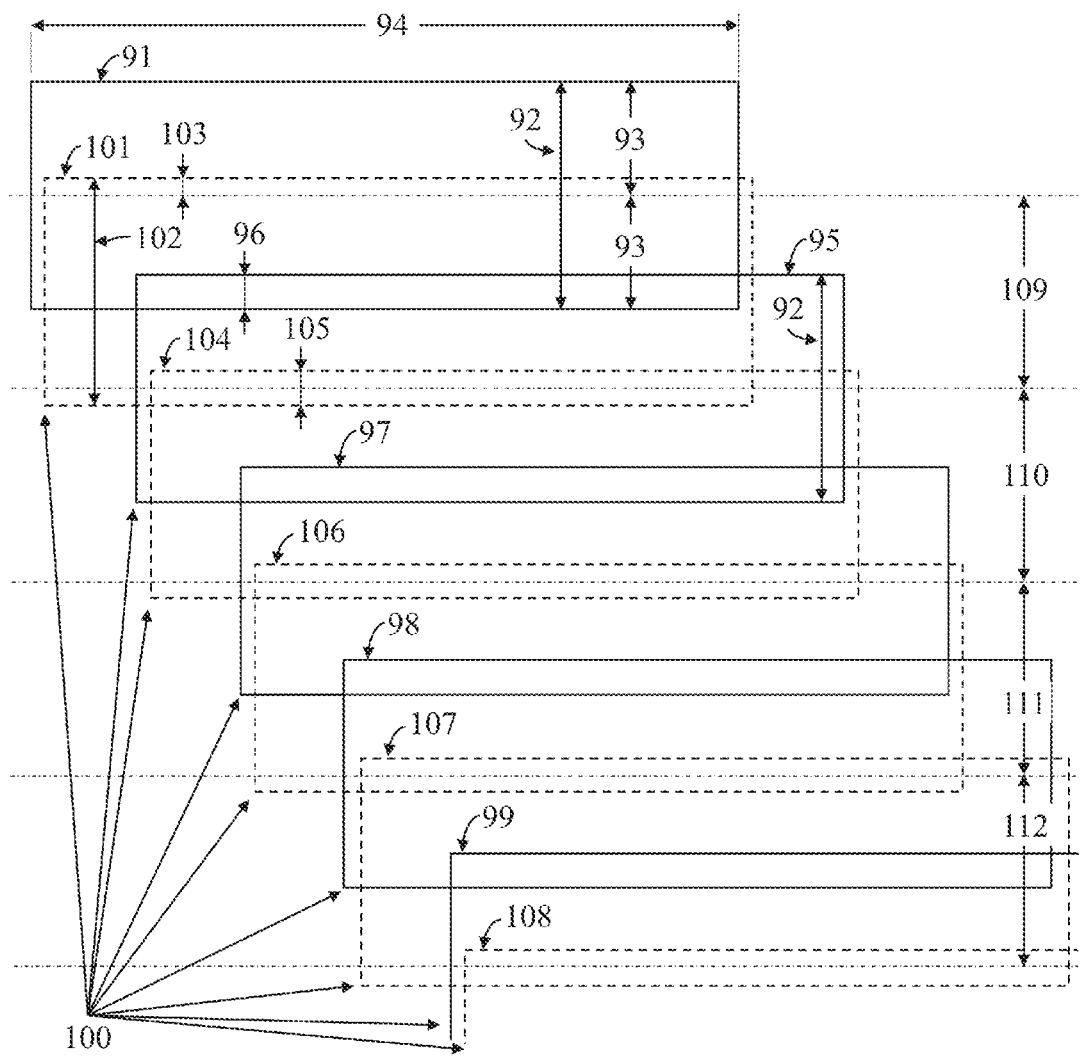
FIG. 15 shows an example of the arrangement of stripes to be exposed according to the "Double-Pass-at-50%-Overlap" exposure method.

FIG. 15 shows the exemplary embodiment 90 of the "Double-Pass-at-50%-Overlap" multi-beam exposure method. This method provides an improved arrangement of the exposure stripes 100 within the substrate field where a desired pattern is to be exposed, while allowing for a reduction, possibly minimization, of errors due to imaging or alignment deviations. The multi-beam exposure of the substrate field starts with exposing stripe 91 with a width 92. In the example of a beam array field of 82 µm×82 µm, as realized in a multi-beam mask writer of the applicant, this width 92 is 82 µm. The symmetry line of stripe 91 is indicated as a dash-dotted line, at a distance 93 from the boundaries of stripe 91. The stripe has a length 94; e.g., for a mask exposure field this length 94 is 132 mm. The next stripe 95, again with width 92 is exposed with an overlap of width 96 as outlined in U.S. Pat. No. 8,378,320 B2 of the applicant. As an example this width 96 is 2 µm so that the distance 109 between the symmetry lines of stripe 91 and strip4 95 is 80 µm. Thus, the distance 109 is an "effective stripe width". The procedure continues with stripes 97, 98, 99 and so on, covering the area to be exposed in a first pass of stripes.

A second set of stripes 101, 104, 106, 107, 108 etc. is exposed with 50% overlap as shown in FIG. 15. These stripes form a second pass covering the area to be exposed on the target (except possibly for, albeit small, margins at the edge of the area). The stripe width 102 is the same as the width 92 of the stripes of the first pass. The upper boundary of stripe 101 is shifted by a distance 103 from the symmetry line of stripe 91, so the stripe 101 covers the latter line. This distance 103 is half of distance 96.

The stripes 101 and 104 are exposed with a small overlap region 105, where the distance 105 is preferably the same as distance 96.

In FIG. 15 the stripes 100 are shown in a staggered arrangement, i.e. shifted in the X-direction, only for viewing purpose, in order to improve the clarity of what is shown; it will be understood that in a realistic multi-beam exposure the stripes align and are typically covering the same length along their common direction (in this case, the x-direction).

Figure 16:
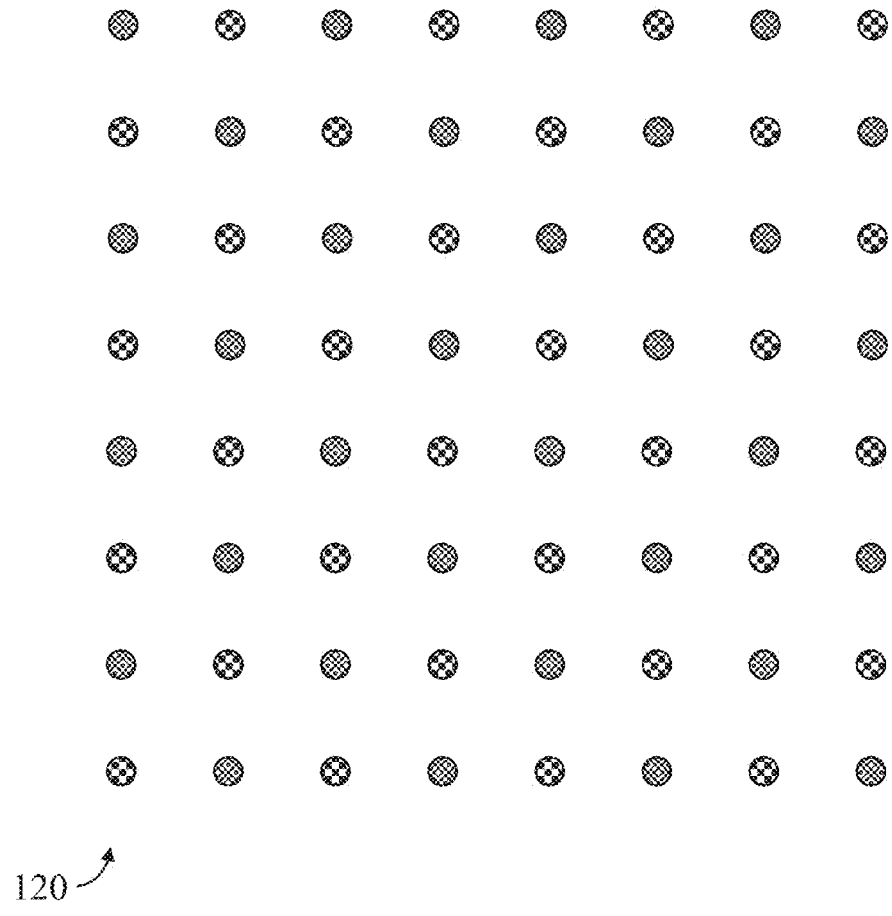
FIG. 16 illustrates the arrangement of exposure spots according to two partial grids with the exposure method shown in FIG. 15 for a "Double-Grid"

FIG. 16 shows how exposure spots may be exposed using two partial grids with the example of the "Double-Pass-at-50%-Overlap" method in the case of "Double-Grid" multi-beam writing 120. The first pass stripes 91, 96-99 are written by exposing exposure spots 121, which are symbolized by centers 122 with a narrow checked hatching as illustrated in the insert of FIG. 16A, whereas the second pass stripes 101, 104, 106-108, which are arranged at a 50% overlap with the stripes of the first pass, are made exposing exposure spots 121 symbolized by centers 123 depicted with a wider checked hatching, cf. the insert of FIG. 16B.

Figure 16A:
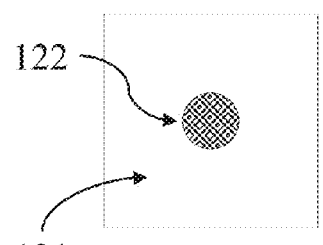
FIGS. 16A,B demonstrate the graphical representation of the exposure spots shown in FIG. 16, for the first and second pass, respectively.
Figure 17:
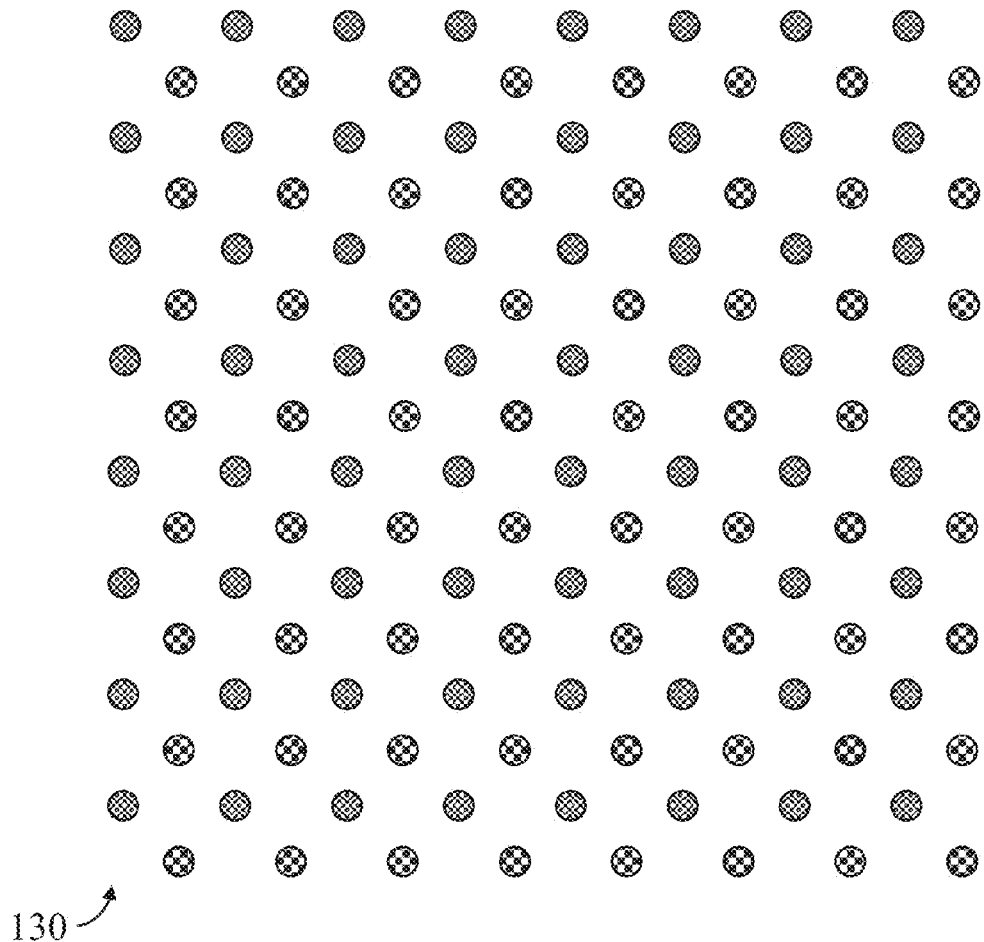
FIG. 17 illustrates the arrangement of exposure spots according to two partial grids with the exposure method of FIG. 15 for a "Centered-Double-Grid"

FIG. 17 illustrates another example, namely, for the analogous case 130 for "Centered-Double-Grid" multi-beam exposure. The exposure spots are again symbolized by checked hatchings as depicted in FIGS. 16A+B.

Figure 16B:
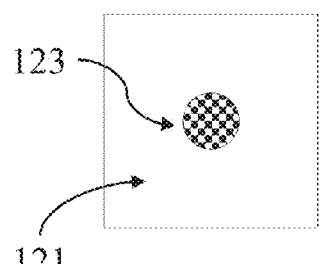
Figure 18:
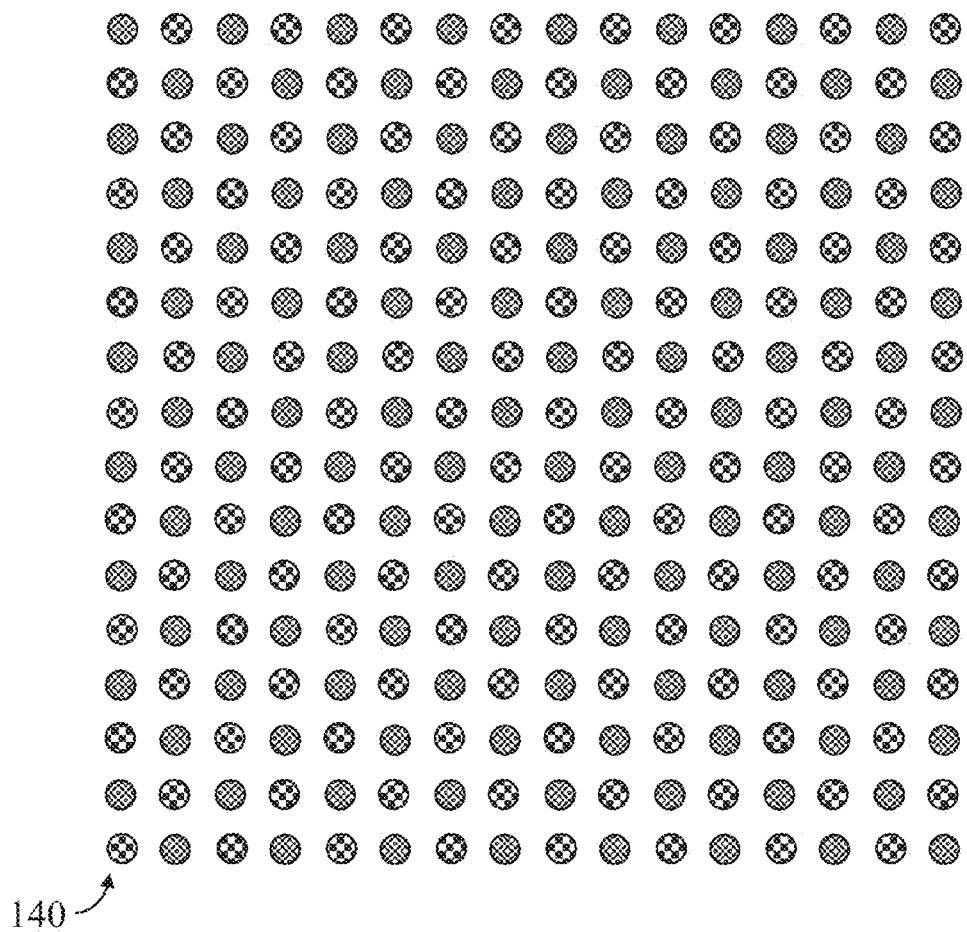
FIG. 18 illustrates the arrangement of exposure spots according to two partial grids with the exposure method of FIG. 15 for a "Quad-Grid"

FIG. 18 shows a further example, namely, for the analogous case 140 for "Quad-Grid" multi-beam exposure of multiple stripes composed of exposure spots 121 using again the checked hatched symbols of FIGS. 16A+B.

Figure 19:
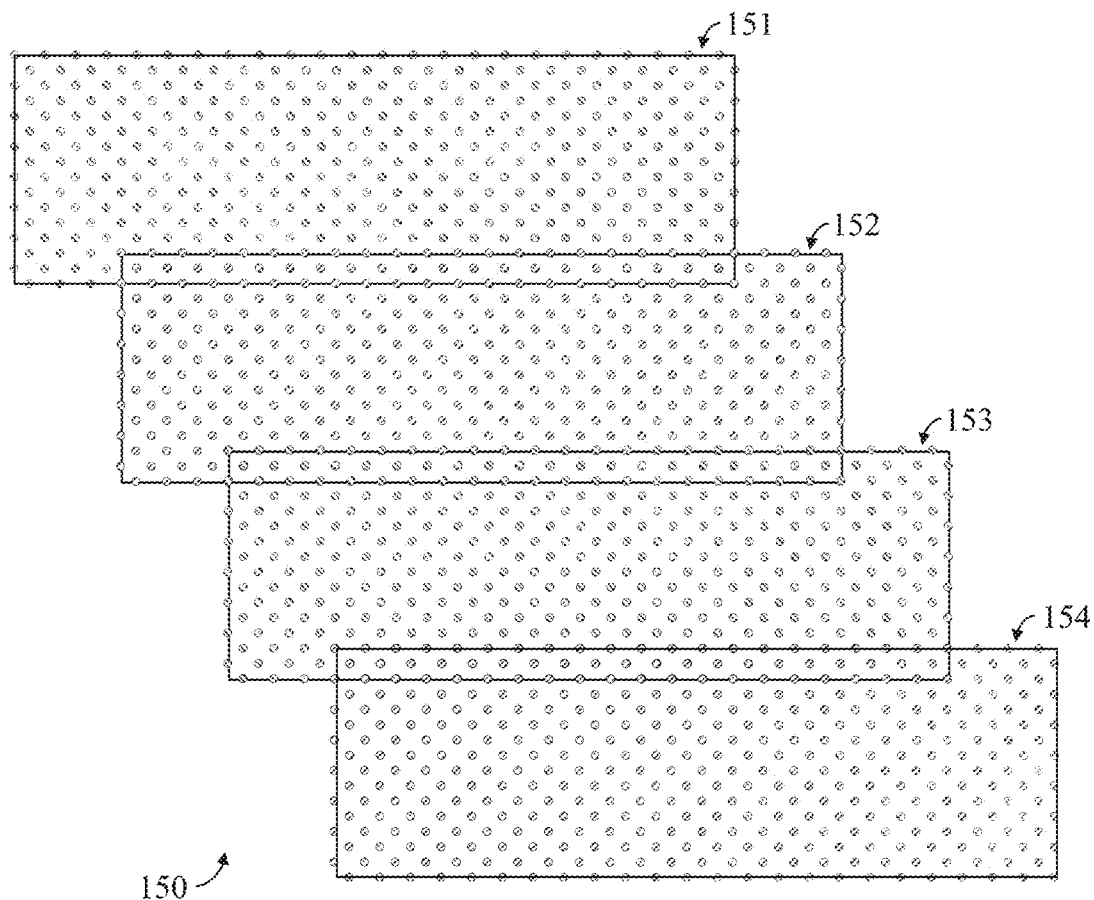
FIG. 19 illustrates the arrangement of exposure spots written in the stripes of a first pass of FIG. 18.
Figures 19A, 19B:
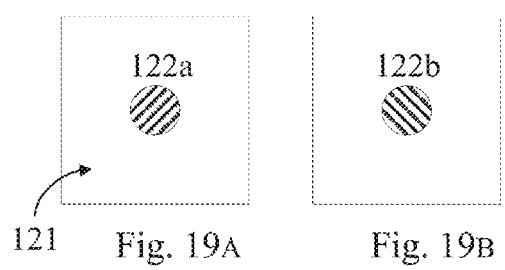
FIGS. 19A,B show the graphical representation of the exposure spots used in FIG. 19, for the odd-numbered and even-numbered stripes, respectively, of the first pass.
Figure 20:
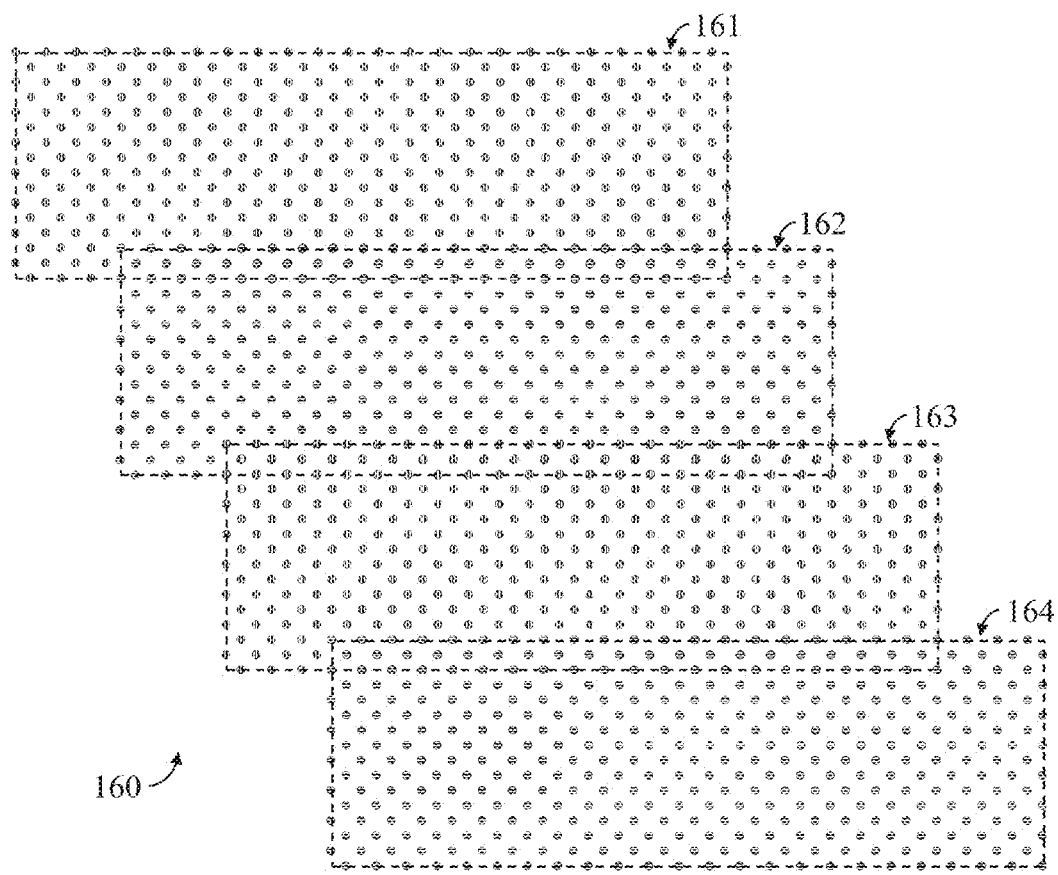
FIG. 20 illustrates the arrangement of exposure spots written in the stripes of a second pass of FIG. 18.
Figures 20A, 20B:
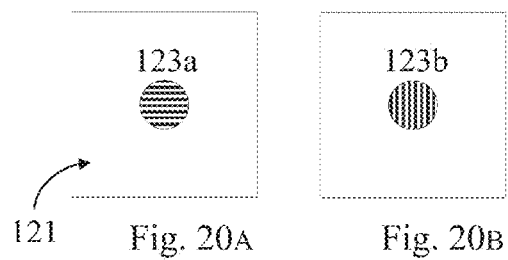
FIGS. 20A,B show the graphical representation of the exposure spots used in FIG. 20, for the odd-numbered and even-numbered stripes, respectively, of the second pass.
Figure 21:
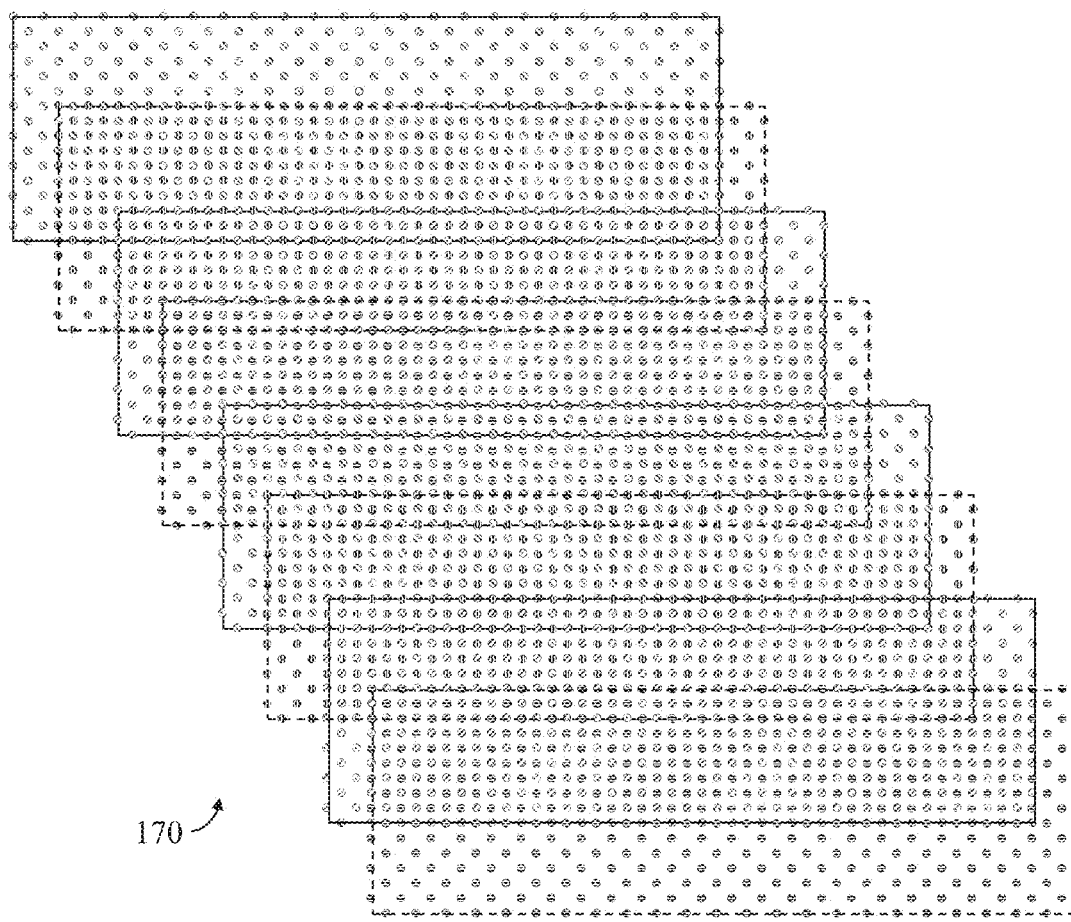
FIG. 21 shows the combined exposure spots of FIGS. 19 and 20.

This "Quad-Grid" example is illustrated in more detail in FIGS. 19 to 21: FIG. 19 shows a first sequence 150 of stripe exposures comprising: stripe exposures 151 and 153, with exposure spots 121 denoted by their respective centers 122a, with a hatching as depicted FIG. 19A; and stripe exposures 152 and 154, with exposure spots 121 denoted by their respective centers 122b, see FIG. 19B. FIG. 20 shows a second sequence 160 comprising: overlapping stripe exposures 161 and 163, with exposure spots 121 denoted by their respective centers 123a, cf. FIG. 20A; and stripe exposures 162 and 164, with exposure spots 121 denoted by their respective centers 123b, cf. FIG. 20B.

Finally, FIG. 21 shows the complete exposure 170 as generated by overlapping the exposures of FIG. 19 and FIG. 20 according to the "Double-Pass-at-50%-Overlap".

The stripes are written in several sweeps, for instance two sweeps, which employ different writing directions for the stripes belonging to the respective sweep while each sweep covers the exposure area on the target. In other words, the stripes in each sweep run basically parallel, but with different general direction for each sweep. The term "general direction" is meant to refer to both ways of moving along a given direction on the target plane, such as ±x or ±y, where the symbol ±denotes that both ways belong to the same general direction. Each sweep contains a number of stripes, i.e. at least one stripe, but usually a plurality of stripes with a considerable number depending on the respective application and pattern to be written.

Figure 22:
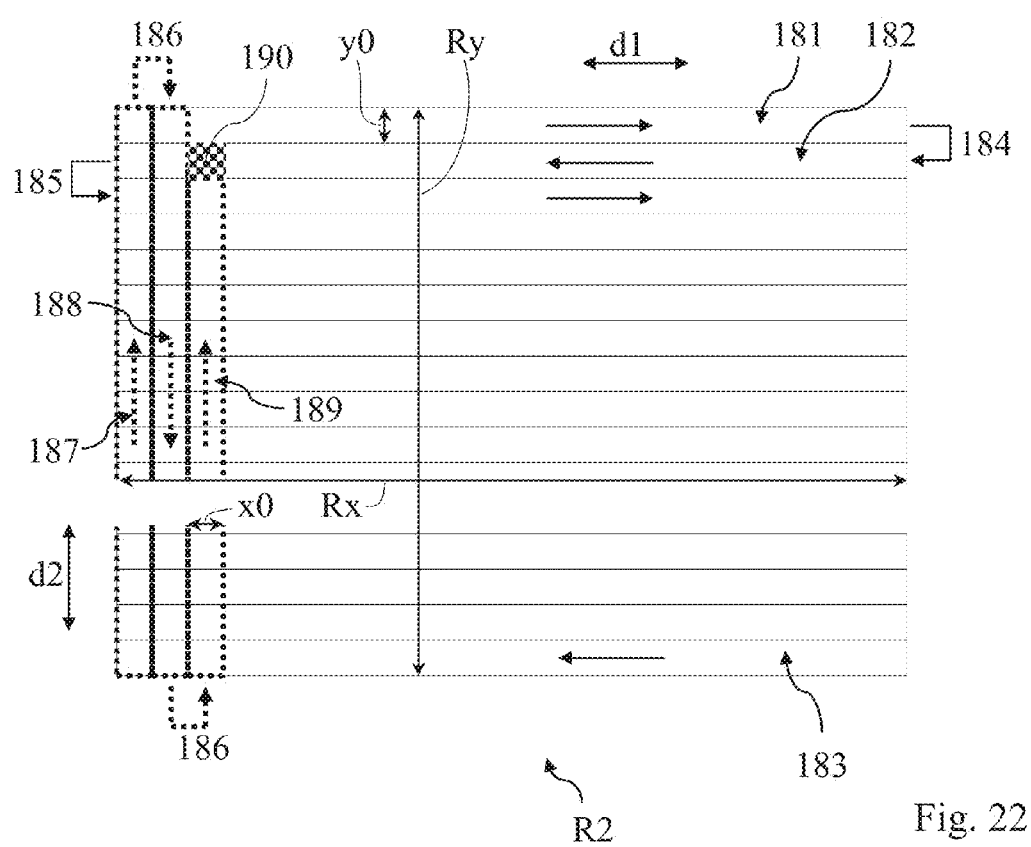
FIG. 22 shows an example of an arrangement of stripes arranged along multiple directions, as an example of a "Bi-Directional-Double-Pass" exposure method.

FIG. 22 illustrates an embodiment of the "Bi-Directional-Double-Pass" multi-beam exposure method according to certain embodiments of the invention. The reference R2 denotes an exposure area on the target; it has dimensions Rx×Ry as measured along the x- and y-directions, respectively. In a first sweep, stripes 181, 182, . . . 183, are written, which extend along one direction d1 (along ±x, horizontal in FIG. 22) and have widths y0, where the width is measured across the corresponding direction of extension ("general direction") of the stripe. At the end of each stripe (but the last) the target stage turns to the start of the next stripe, preferably combined with a reversal of direction while maintaining the general direction d1; thus performing end turns 184, 185 . . . between the stripes. Then a second sweep is carried out, in which stripes 187, 188, 189 . . . are written; these stripes extend along the perpendicular direction d2 (along ±y, vertical in FIG. 22) and have widths x0. Between the stripes of the second sweep, stage turns 186 are performed. Thus, between sweeps the general direction d1, d2 is changed; in other words each sweep is associated with a specific general direction.

Figure 23:
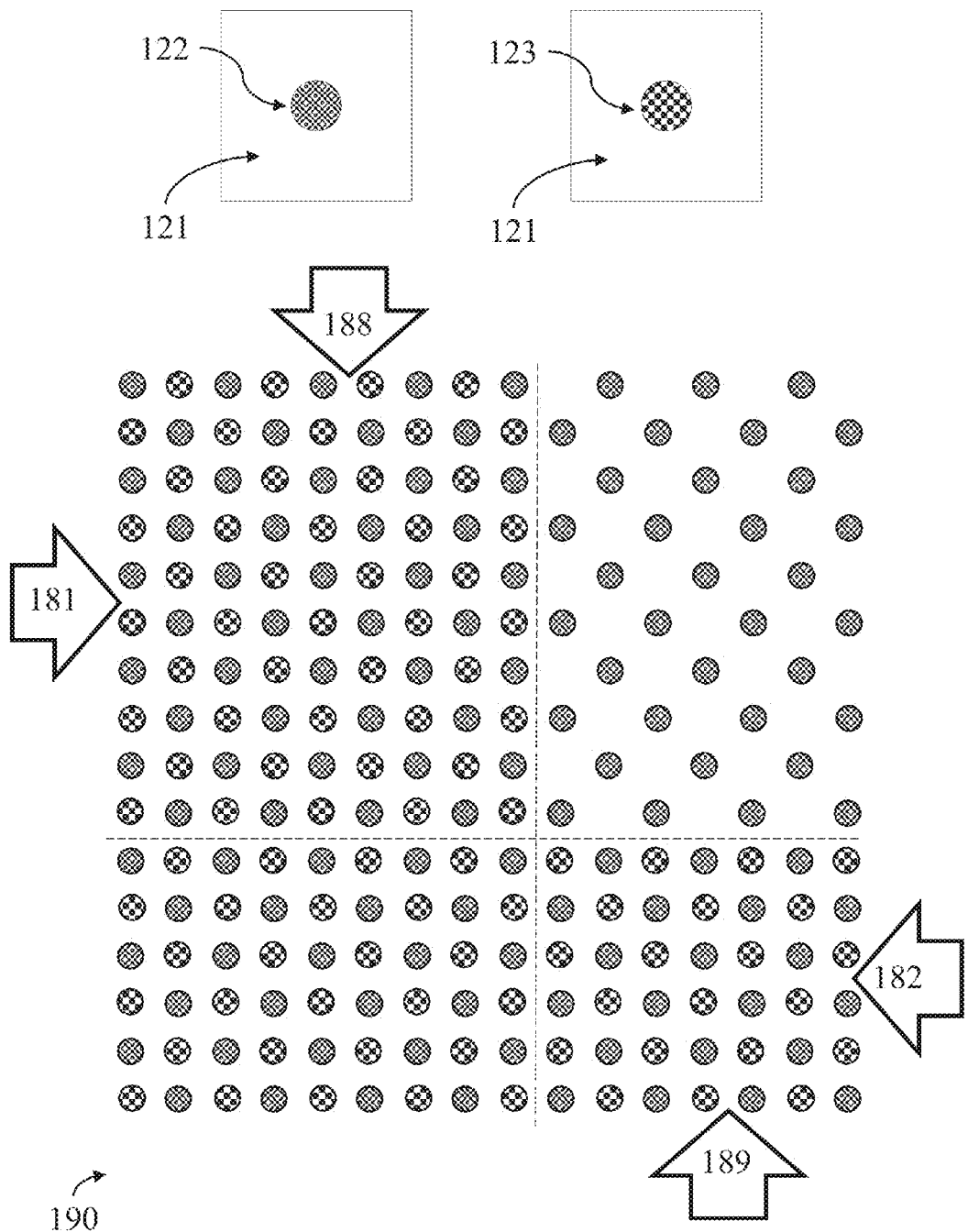
FIG. 23 illustrates the arrangement of exposure spots according to partial grids with the method illustrated in FIG. 22.

Further in FIG. 22, the stripe 189, which belongs to the second sweep, is depicted in the progress of being written: An area 190 is shown which is just being written as part of the perpendicular stripe 189. FIG. 23 shows an enhanced view of the area at the cross-border between horizontal stripes 181 and 182, and vertical stripes 188 and 189. In this depiction, the exposure spots 121 with center by circles 122 correspond to stripe exposures 181, 182, etc.; and the exposure spots 121 with centers 123 symbolize vertical stripe exposures 188 and 189 filling in the space 190.

The "Bi-Directional-Double-Pass" multi-beam exposure according to many embodiments of the invention provides an enhanced coverage to reduce stripe boundary errors.

The stripes 181, . . . 183 of the first sweep are written with half the exposure dose, whereas the stripes 187, 188, 189, . . . of the second sweep provide the other half of the exposure dose. Therefore, with a given data path rate, the stripe exposures can be done at double stage velocity speed. Thus, the writing time for the exposure field R2 is the same as compared to single pass writing with the full spot coverage. With respect to overall writing time, the Double-Pass methods may have somewhat higher stage return overheads, which can be kept sufficiently low to be negligible.

While the depiction of FIG. 23 is with regard to the Bi-Directional for the case of Quad-Grid multi-beam writing, it will be evident for the skilled person to adapt the Bi-Directional-Double-Pass multi-beam exposure for the Double-Grid and the Centered-Double-Grid multi-beam exposure techniques in an analogous way.

In the case of two sweeps, the two general directions d1, d2 may be oriented perpendicular to each other, in particular at 90°, for instance ±x, ±y coinciding with the x- and y-directions of the target stage. Generally, the number of sweeps may be more than two. The general directions may be different for each sweep, for instance at angles smaller than 90°. Alternatively or in combination, the general direction of non-consecutive sweeps may be the same, for instance in a sequence like ±x, ±y, ±x, ±y for four sweeps.

Figure 24A:
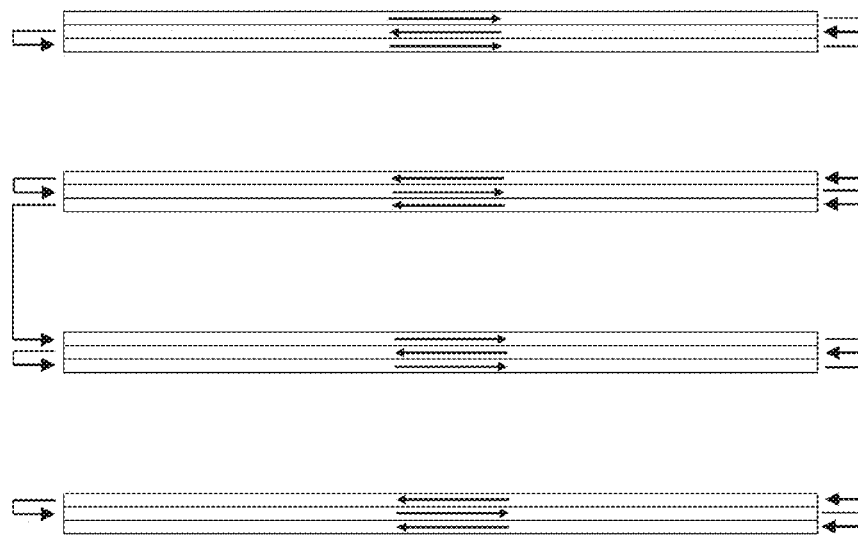
FIGS. 24A,B illustrates a variant of the chronology of writing the stripes that are oriented along a given direction, with FIG. 24A showing the sequence for the stripes of a first run, and FIG. 24B showing the stripes of a second run in addition to those of the first run of FIG. 24A.
Figure 24B:

As pointed out in US 2015/0028230 A1 it is not necessary that the exposures of stripes 181, . . . 183 belonging to the same sweep be done one after the other, but may be done in groups, e.g. of three stripes each, with a distance between the groups as shown in FIG. 24A, where the distance between the groups of stripes is such that an integer of stripe groups fits in between. FIG. 24B shows the exposure of the second groups of three stripes each for this example. This method can be implemented for the vertical stripes as well. Of course, the number of stripes in each group may take any suitable integer value.

With the present methods disclosed here a further reduction of errors can be achieved, in particular with respect to substrate heating.

The invention claimed is:

1. A method for irradiating a target with a beam of energetic radiation formed by electrically charged particles, comprising:
providing a pattern definition device having a plurality of apertures transparent to said radiation,
illuminating said pattern definition device using an illuminating wide beam, which traverses the pattern definition device through said apertures thus forming a patterned beam consisting of a corresponding plurality of beamlets,
forming said patterned beam into a pattern image on the location of the target, said pattern image comprising the images of at least part of the plurality of apertures covering a number of pattern pixels on the target, and
generating a relative movement between said target and the pattern definition device producing a movement of said pattern image on the target along a path over a region where a beam exposure is to be performed, said path being composed of sections which each extend along a general direction, said region being composed of a plurality of pattern pixels arranged in a regular arrangement and said region having a total width as measured across said general direction, the movement along said path defining a number of stripes covering said region in sequential exposures,
wherein the number of stripes are written in at least two sweeps, each sweep having a respective general direction, and the general direction being changed between sweeps,
wherein each stripe belongs to exactly one of said sweeps,
wherein the stripes in each sweep run substantially parallel to each other along the respective general direction, the stripes having respective widths as measured across said main direction, and for each sweep the widths of the stripes of one sweep combining into a cover of the total width.

2. The method of claim 1, wherein each sweep is associated with one of a number of partial grids of pattern pixels which are exposable during the respective sweep, the partial grids being mutually different and, when taken together, combining to the complete plurality of pattern pixels which are comprised in said region where a beam exposure is to be performed.

3. The method of claim 1, wherein groups of stripes belonging to the same sweep are written subsequently in time.

4. The method of claim 1, wherein stripes written with the same general direction are written with alternating orientation of said general direction.

5. The method of claim 1, wherein the stripes of each sweep have uniform width.

6. The method of claim 1, wherein within each sweep the stripes are exposed at lateral offsets to each other which correspond to the respective widths of the stripes.

7. The method of claim 1, wherein the stripes of at least one of the sweeps are overlapping, wherein in the range of overlap of two stripes of the same sweep:
nominal positions of pattern pixels of one of the two stripes are overlapping with nominal positions of corresponding pattern pixels of the other of the two stripes, and
pattern pixels are exposed in the two overlapping stripes in a complementary manner with regard to the pattern to be imposed.

8. The method of claim 7, wherein the stripes of all of the sweeps are overlapping.

9. The method of claim 1, wherein the general directions of consecutive sweeps are in a right angle to each other.

10. The method of claim 1, wherein the number of stripes are written in two sweeps.

11. The method of claim 1, wherein in at least one of the sweeps, a plurality of stripes is written,
wherein the plurality of stripes of each sweep are distributed into at least two groups of spatially adjacent stripes, and the stripes are written either in a time sequence wherein either each stripe is followed by a non-adjacent stripe of a different group, or in a time sequence wherein the stripes are written in groups of stripes according to the order of the groups, with each group of stripes being followed by a non-adjacent different group.

12. The method of claim 11, wherein a plurality of stripes is written in each sweep.

13. The method of claim 1, wherein during generating the relative movement between the target and the pattern definition device a target stage is used, said target stage being configured to continuously move the target along at least two of the general directions, wherein an offset from a nominal position, which offset occurs during a movement by a first distance along either of said at least two of the general directions, is always less than a fraction of the first distance, said fraction being in the order of 0.001.

14. A charged-particle multi-beam processing apparatus for exposure of a target using a structured beam of electrically charged particles, comprising:
an illumination system,
a pattern definition device,
a projection optics system, and
a target stage,
the illumination system being configured to produce a beam of said electrically charged particles and form it into an illuminating wide beam illuminating the pattern definition device, the pattern definition device being configured to form the shape of the illuminating beam into a patterned beam composed of a plurality of beamlets, and the projection optics system being configured to form said patterned beam into a pattern image on the location of the target, thus exposing a plurality of pattern pixels on the target,
the target stage being configured to generate a relative movement between said target and the pattern definition device,
wherein said apparatus is configured to:
generate a relative movement between said target and the pattern definition device producing a movement of said pattern image on the target along a path over a region where a beam exposure is to be performed, said path being composed of sections which each extend along a general direction, said region being composed of a plurality of pattern pixels arranged in a regular arrangement and said region having a total width as measured across said general direction, the movement along said path defining a number of stripes covering said region in sequential exposures,
wherein the number of stripes are written in at least two sweeps, each sweep having a respective general direction, and the general direction being changed between sweeps,
wherein each stripe belongs to exactly one of said sweeps,
wherein the stripes in each sweep run substantially parallel to each other along the respective general direction, the stripes having respective widths as measured across said main direction, and for each sweep the widths of the stripes of one sweep combining into a cover of the total width.

15. The charged-particle multi-beam processing apparatus of claim 14, wherein said target stage is configured to continuously move the target along at least two of the general directions, wherein an offset from a nominal position, which offset occurs during a movement by a first distance along either of said at least two of the general directions, is always less than a fraction of the first distance, said fraction being in the order of 0.001.

16. The charged-particle multi-beam processing apparatus of claim 15, wherein said target stage comprises air bearings enabling high stage velocity in an X and a Y direction in the target plane.

* * * * *